(12) United States Patent
Chida et al.

(10) Patent No.: US 8,284,369 B2
(45) Date of Patent: Oct. 9, 2012

(54) FLEXIBLE LIGHT-EMITTING DEVICE, AND METHOD FOR FABRICATING THE SAME

(75) Inventors: Akihiro Chida, Kanagawa (JP); Kaoru Hatano, Kanagawa (JP); Takaaki Nagata, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 505 days.

(21) Appl. No.: 12/538,975

(22) Filed: Aug. 11, 2009

(65) Prior Publication Data

US 2010/0045919 A1 Feb. 25, 2010

(30) Foreign Application Priority Data

Aug. 20, 2008 (JP) ................................. 2008-211281

(51) Int. Cl.
*G02F 1/1345* (2006.01)
*B60Q 1/14* (2006.01)
*H01L 21/00* (2006.01)

(52) U.S. Cl. ........................... 349/149; 362/278; 438/30

(58) Field of Classification Search .................. 349/149; 362/278; 438/30; 257/E33.061
See application file for complete search history.

(56) References Cited

U.S. PATENT DOCUMENTS

| 5,055,899 | A | 10/1991 | Wakai et al. |
| 5,075,166 | A | 12/1991 | Sikorski et al. |
| 5,597,631 | A | 1/1997 | Furumoto et al. |
| 5,757,456 | A | 5/1998 | Yamazaki et al. |
| 5,770,313 | A | 6/1998 | Furumoto et al. |
| 5,821,138 | A | 10/1998 | Yamazaki et al. |
| 5,821,622 | A | 10/1998 | Tsuji et al. |
| 5,879,502 | A | 3/1999 | Gustafson |
| 5,990,542 | A | 11/1999 | Yamazaki |
| 5,994,721 | A | 11/1999 | Zhong et al. |
| 6,011,274 | A | 1/2000 | Gu et al. |
| 6,015,724 | A | 1/2000 | Yamazaki |
| 6,115,094 | A | 9/2000 | Fukunaga |
| 6,118,502 | A | 9/2000 | Yamazaki et al. |
| 6,153,893 | A | 11/2000 | Inoue et al. |
| 6,224,965 | B1 | 5/2001 | Haas et al. |
| 6,294,478 | B1 | 9/2001 | Sakaguchi et al. |
| 6,346,718 | B1 | 2/2002 | Yamanaka et al. |
| 6,372,608 | B1 | 4/2002 | Shimoda et al. |

(Continued)

FOREIGN PATENT DOCUMENTS

CN 1231065 A 10/1999

(Continued)

*Primary Examiner* — Mike Qi
(74) *Attorney, Agent, or Firm* — Husch Blackwell LLP

(57) ABSTRACT

Provided is a flexible light-emitting device including: a base insulating film; a thin film transistor formed over a first surface of the base insulating film; an interlayer insulating film formed over the first surface of the base insulating film with the thin film transistor interposed therebetween; a first pixel electrode formed on a second surface of the base insulating film opposite to the first surface; an electroluminescent layer formed on the second surface of the base insulating film with the first pixel electrode interposed therebetween; a second pixel electrode formed on the second surface of the base insulating film with the first pixel electrode and the electroluminescent layer interposed therebetween; and a wiring electrically connected to a semiconductor layer of the thin film transistor in a contact hole provided in the interlayer insulating film and electrically connected to the first pixel electrode in a through-hole penetrating through at least the interlayer insulating film and the base insulating film.

7 Claims, 6 Drawing Sheets

U.S. PATENT DOCUMENTS

| | | | |
|---|---|---|---|
| 6,376,333 B1 | 4/2002 | Yamazaki et al. | |
| 6,403,221 B1 | 6/2002 | Nakamura et al. | |
| 6,482,495 B1 | 11/2002 | Kohama et al. | |
| 6,491,228 B1 | 12/2002 | Ueda et al. | |
| 6,492,026 B1 | 12/2002 | Graff et al. | |
| 6,506,664 B1 | 1/2003 | Beyne et al. | |
| 6,521,511 B1 | 2/2003 | Inoue et al. | |
| 6,682,963 B2 | 1/2004 | Ishikawa | |
| 6,689,492 B1 * | 2/2004 | Yamazaki et al. | 428/690 |
| 6,762,508 B1 | 7/2004 | Kiso et al. | |
| 6,784,457 B2 | 8/2004 | Yamazaki et al. | |
| 6,849,877 B2 * | 2/2005 | Yamazaki et al. | 257/86 |
| 6,878,607 B2 | 4/2005 | Inoue et al. | |
| 6,933,533 B2 | 8/2005 | Yamazaki et al. | |
| 6,953,951 B2 | 10/2005 | Yamazaki et al. | |
| 6,998,282 B1 | 2/2006 | Yamazaki et al. | |
| 7,005,671 B2 * | 2/2006 | Yamazaki et al. | 257/40 |
| 7,049,178 B2 | 5/2006 | Kim et al. | |
| 7,050,138 B1 | 5/2006 | Yamazaki et al. | |
| 7,061,083 B1 | 6/2006 | Usami et al. | |
| 7,067,976 B2 * | 6/2006 | Yamazaki | 313/512 |
| 7,147,530 B2 | 12/2006 | Yamazaki et al. | |
| 7,147,740 B2 | 12/2006 | Takayama et al. | |
| 7,229,900 B2 | 6/2007 | Takayama et al. | |
| 7,332,381 B2 | 2/2008 | Maruyama et al. | |
| 7,361,519 B2 | 4/2008 | Yamazaki et al. | |
| 7,374,977 B2 | 5/2008 | Yamazaki et al. | |
| 7,422,935 B2 | 9/2008 | Yamazaki | |
| 7,459,352 B2 | 12/2008 | Yamazaki et al. | |
| 7,485,489 B2 | 2/2009 | Bjorbell | |
| 7,487,373 B2 | 2/2009 | Koyama | |
| 7,728,332 B2 | 6/2010 | Yamazaki | |
| 7,736,958 B2 | 6/2010 | Dozen et al. | |
| 7,736,964 B2 | 6/2010 | Yamamoto et al. | |
| 8,034,694 B2 | 10/2011 | Ohnuma et al. | |
| 8,044,296 B2 | 10/2011 | Yamazaki et al. | |
| 2003/0032210 A1 | 2/2003 | Takayama et al. | |
| 2003/0040164 A1 | 2/2003 | Inoue et al. | |
| 2003/0071953 A1 | 4/2003 | Yamazaki et al. | |
| 2003/0082889 A1 | 5/2003 | Maruyama et al. | |
| 2004/0016939 A1 | 1/2004 | Akiba et al. | |
| 2004/0061438 A1 | 4/2004 | Yamazaki et al. | |
| 2004/0229404 A1 | 11/2004 | Kiso et al. | |
| 2005/0070038 A1 | 3/2005 | Yamazaki et al. | |
| 2005/0085034 A1 | 4/2005 | Akiba et al. | |
| 2005/0162578 A1 | 7/2005 | Yamazaki et al. | |
| 2005/0200301 A1 | 9/2005 | Yamazaki et al. | |
| 2005/0212416 A1 | 9/2005 | Seo et al. | |
| 2005/0233122 A1 | 10/2005 | Nishimura et al. | |
| 2005/0242713 A1 | 11/2005 | Yamazaki | |
| 2005/0258441 A1 | 11/2005 | Shitagami | |
| 2006/0011288 A1 | 1/2006 | Watanabe et al. | |
| 2006/0079034 A1 | 4/2006 | Hoffman | |
| 2006/0110863 A1 | 5/2006 | Yamamoto et al. | |
| 2006/0132461 A1 | 6/2006 | Furukawa et al. | |
| 2007/0004125 A1 | 1/2007 | Watanabe et al. | |
| 2007/0004202 A1 | 1/2007 | Fujii | |
| 2007/0020932 A1 | 1/2007 | Maruyama et al. | |
| 2007/0026580 A1 | 2/2007 | Fujii | |
| 2007/0044303 A1 | 3/2007 | Yamano | |
| 2007/0063646 A1 | 3/2007 | Yamazaki et al. | |
| 2007/0181875 A1 | 8/2007 | Yamazaki et al. | |
| 2007/0212853 A1 | 9/2007 | Maruyama et al. | |
| 2007/0259585 A1 | 11/2007 | Yamazaki et al. | |
| 2007/0278563 A1 | 12/2007 | Takano et al. | |
| 2008/0012126 A1 | 1/2008 | Dozen et al. | |
| 2008/0044940 A1 | 2/2008 | Watanabe et al. | |
| 2008/0093464 A1 | 4/2008 | Dairiki et al. | |
| 2008/0143247 A1 | 6/2008 | Kim et al. | |
| 2008/0224940 A1 | 9/2008 | Sugiyama et al. | |
| 2008/0224941 A1 | 9/2008 | Sugiyama et al. | |
| 2008/0252531 A1 | 10/2008 | Hanaoka et al. | |
| 2008/0280033 A1 | 11/2008 | Yamazaki et al. | |
| 2008/0303140 A1 | 12/2008 | Ohtani et al. | |
| 2008/0309581 A1 | 12/2008 | Fujii et al. | |
| 2009/0314527 A1 | 12/2009 | Hatano et al. | |
| 2010/0006845 A1 | 1/2010 | Seo et al. | |
| 2010/0007829 A1 | 1/2010 | Oikawa et al. | |
| 2010/0013372 A1 * | 1/2010 | Oikawa et al. | 313/498 |
| 2010/0237354 A1 | 9/2010 | Yamamoto et al. | |
| 2011/0306162 A1 | 12/2011 | Yamazaki et al. | |
| 2012/0025274 A1 | 2/2012 | Ohnuma et al. | |

FOREIGN PATENT DOCUMENTS

| | | |
|---|---|---|
| CN | 1278660 A | 1/2001 |
| EP | 0 924 769 A1 | 6/1999 |
| EP | 0 939 441 A2 | 9/1999 |
| EP | 1 058 484 A1 | 12/2000 |
| EP | 1 092 739 A1 | 4/2001 |
| EP | 1 589 797 A2 | 10/2005 |
| EP | 1 758 438 A2 | 2/2007 |
| EP | 1 970 951 A2 | 9/2008 |
| EP | 2 037 433 A1 | 3/2009 |
| JP | 5-190582 A | 7/1993 |
| JP | 8-250745 A | 9/1996 |
| JP | 8-288522 A | 11/1996 |
| JP | 10-92980 A | 4/1998 |
| JP | 10-302027 A | 11/1998 |
| JP | 11-26733 A | 1/1999 |
| JP | 2000-231619 A | 8/2000 |
| JP | 2001-052873 A | 2/2001 |
| JP | 2001-277726 A | 10/2001 |
| JP | 2003-174153 A | 6/2003 |
| JP | 2003-204049 A | 7/2003 |
| JP | 2004-118255 A | 4/2004 |
| JP | 2004-362341 A | 12/2004 |
| JP | 2005-63781 A | 3/2005 |
| JP | 2005-140818 A | 6/2005 |
| JP | 2006-4907 A | 1/2006 |
| JP | 2006-133573 A | 5/2006 |
| JP | 2006-139802 A | 6/2006 |
| JP | 2006-259049 A | 9/2006 |
| JP | 2007-12815 A | 1/2007 |
| JP | 2007-241999 A | 9/2007 |
| TW | 382820 B | 2/2000 |
| WO | WO 96/09158 A1 | 3/1996 |
| WO | WO 01/01740 A1 | 1/2001 |
| WO | WO 2004/001848 A1 | 12/2003 |
| WO | WO 2007/144995 A1 | 12/2007 |
| WO | WO 2008/032526 A1 | 3/2008 |

* cited by examiner

FLEXIBLE LIGHT-EMITTING DEVICE, AND METHOD FOR FABRICATING THE SAME

BACKGROUND OF THE INVENTION

1. Field of the Invention

The present invention relates to a light-emitting device which has a circuit including a thin film transistor (hereinafter also referred to as a TFT) using a crystalline semiconductor layer and fabricating the light-emitting device. In addition, the present invention relates to an electronic device mounted with such a light-emitting device.

2. Description of the Related Art

In recent years, a technological development has been remarkably made in the field of displays. In particular, the needs of the market have stimulated tremendous progress in the technology directed to increase in resolution of displays and thinning of displays.

In a next phase of this field, focus is placed on commercialization of a flexible display having a curved display area. Further, a light-emitting device using a flexible substrate can be made lightweight as compared to the case of using a glass substrate or the like. A variety of proposals have been made on manufacturing the flexible display (for example, see Patent Document 1).

However, such a flexible display is also required to have high image quality.

A variety of factors influence the image quality. For example, use of a TFT with high mobility as a pixel TFT is effective for an active matrix light-emitting device.

CITATION LIST

Patent Document

Patent Document 1

Japanese Published Patent Application No. 2003-204049

SUMMARY OF THE INVENTION

In order to provide a high-quality image or to provide a driver circuit over the same substrate as the pixel TFT as described above, it is possible to use a TFT using a crystalline semiconductor with high mobility. However, in order to obtain such a TFT, at present, a process at a rather high temperature to some degree is needed at the time of formation. Therefore, it has been difficult to form a TFT using a crystalline semiconductor with high mobility over a flexible substrate with low heat resistance.

According to one embodiment of the present invention, it is an object to provide a flexible light-emitting device provided with a TFT using a crystalline semiconductor which enables displaying of a high-quality image.

One embodiment of the present invention in order to solve the above objects is a flexible light-emitting device including: a base insulating film; a TFT formed over a first surface of the base insulating film; an interlayer insulating film formed over the first surface of the base insulating film with the TFT interposed therebetween; a first pixel electrode formed under a second surface of the base insulating film opposite to the first surface; an electroluminescent (hereinafter, referred to as EL) layer formed under the second surface of the base insulating film with the first pixel electrode interposed therebetween; a second pixel electrode formed under the second surface of the base insulating film with the first pixel electrode and the EL layer interposed therebetween; and a wiring which is electrically connected to a semiconductor layer of the TFT in a contact hole provided in the interlayer insulating film and is electrically connected to the first pixel electrode in a through-hole penetrating through at least the interlayer insulating film and the base insulating film.

One embodiment of the present invention is a method for manufacturing a flexible light-emitting device including the steps of: forming a separation layer over a formation substrate; forming a base insulating film over the separation layer; forming an island-like crystalline semiconductor layer over the base insulating film; forming a gate insulating film over the crystalline semiconductor layer; forming an island-like gate electrode over the gate insulating film which overlaps with the crystalline semiconductor layer; forming an interlayer insulating film over the gate electrode and the gate insulating film; forming a contact hole which penetrates through at least the interlayer insulating film and the gate insulating film and reaches the crystalline semiconductor layer, and a through-hole which penetrates through at least the interlayer insulating film, the gate insulating film, and the base insulating film and reaches (penetrates into) the separation layer; forming a wiring which is electrically connected to the crystalline semiconductor layer in the contact hole and reaches (penetrates into) at least the separation layer in the through-hole; bonding a flexible substrate onto the wiring and the interlayer insulating film; separating an object provided with elements from the base insulating film to the flexible substrate from the formation substrate; forming a first pixel electrode which is in contact with the base insulating film exposed by the separation and is electrically connected to the wiring; forming a partition wall covering an end portion of the first pixel electrode; forming an EL layer in contact with at least the first pixel electrode; and forming a second pixel electrode in contact with at least the EL layer.

One embodiment of the present invention is a method for manufacturing a flexible light-emitting device including the steps of: forming a separation layer over a formation substrate; forming a base insulating film over the separation layer; forming an island-like crystalline semiconductor layer over the base insulating film; forming a gate insulating film over the crystalline semiconductor layer; forming an island-like gate electrode over the gate insulating film which overlaps with the crystalline semiconductor layer; forming an interlayer insulating film over the gate electrode and the gate insulating film; forming a contact hole which penetrates through at least the interlayer insulating film and the gate insulating film and reaches the crystalline semiconductor layer, and a through-hole which penetrates through at least the interlayer insulating film, the gate insulating film, and the base insulating film and reaches (penetrates into) the separation layer; forming a wiring which is electrically connected to the crystalline semiconductor layer in the contact hole and reaches (penetrates into) at least the separation layer in the through-hole; bonding a flexible substrate onto the wiring and the interlayer insulating film; separating an object provided with elements from the base insulating film to the flexible substrate from the formation substrate; forming a partition wall which is in contact with the base insulating film exposed by the separation and has an opening so as to expose at least the through-hole; forming a first pixel electrode by disposing a conductive substance with fluidity in the opening of the partition wall; forming an EL layer in contact with at least the first pixel electrode; and forming a second pixel electrode in contact with at least the EL layer.

One embodiment of the present invention is a method for manufacturing a flexible light-emitting device including the steps of: forming a separation layer over a formation substrate; forming a base insulating film over the separation layer; forming an island-like crystalline semiconductor layer over the base insulating film; forming a gate insulating film over the crystalline semiconductor layer; forming an island-like gate electrode over the gate insulating film which overlaps with the crystalline semiconductor layer; forming an interlayer insulating film over the gate electrode and the gate insulating film; forming a contact hole which penetrates through at least the interlayer insulating film and the gate insulating film and reaches the crystalline semiconductor layer; forming a wiring which is electrically connected to the crystalline semiconductor layer in the contact hole; bonding a flexible substrate onto the wiring and the interlayer insulating film; separating an object provided with elements from the base insulating film to the flexible substrate from the formation substrate; forming a through-hole which penetrates through at least the base insulating film, the gate insulating film, the interlayer insulating film, the wiring, and the flexible substrate by irradiating the flexible substrate with a laser beam; forming a connection wiring which is electrically connected to the wiring in the through-hole; forming a first pixel electrode which is in contact with the base insulating film exposed by the separation and is electrically connected to the connection wiring; forming a partition wall covering an end portion of the first pixel electrode; forming an EL layer in contact with at least the first pixel electrode; and forming a second pixel electrode in contact with at least the EL layer.

One embodiment of the present invention is a flexible light-emitting device provided with a TFT using a crystalline semiconductor which enables displaying of a high-quality image.

Another embodiment of the present invention is a method for manufacturing a flexible light-emitting device provided with a TFT using a crystalline semiconductor which enables displaying of a high-quality image.

DETAILED DESCRIPTION OF THE INVENTION

Figure 1A:
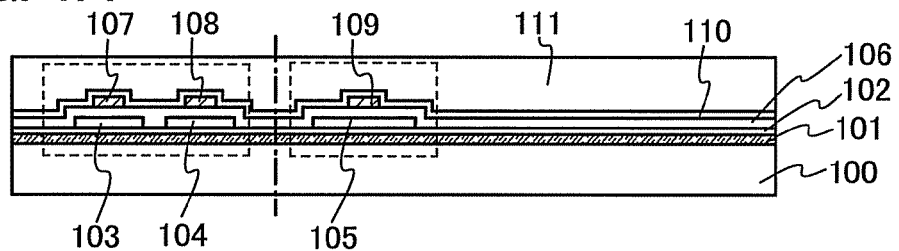
FIGS. 1A to 1F are cross-sectional views showing a flexible light-emitting device and a method for manufacturing the flexible light-emitting device according to one embodiment of the present invention.
Figure 1B:
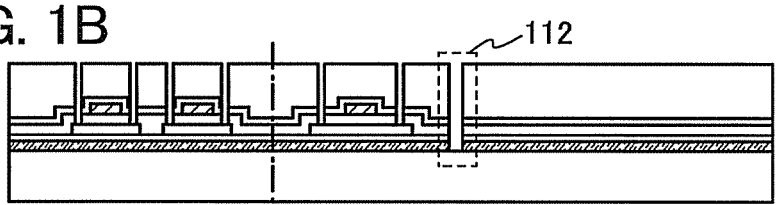

Embodiments of the present invention will be described below with reference to the accompanying drawings. However, the present invention can be implemented in various different embodiments, and it will be readily apparent to those skilled in the art that various changes and modifications in modes and details thereof can be made without departing from the purpose and scope of the present invention. Therefore, the present invention should not be interpreted as being limited to the description of the embodiments given below.

Embodiment 1

FIGS. 1A to 1F show an example of a method for manufacturing a flexible light-emitting device of one embodiment of the present invention. A separation layer 101, a base insulating film 102, crystalline semiconductor layers 103, 104, and 105, a gate insulating film 106, gate electrodes 107, 108, and 109, a passivation film 110, and an interlayer insulating film 111 are formed over a formation substrate 100 (see FIG. 1A). Note that the passivation film 110 may be omitted. As the formation substrate 100, a substrate such as a glass substrate or a ceramics substrate, which can withstand heat applied at the time of formation of the crystalline semiconductor layers 103 to 105, is used. In the present specification, as the crystalline semiconductor layers 103 to 105, a polycrystalline semiconductor or a microcrystalline semiconductor is used which needs to be subjected to crystallization and improvement in crystallinity at a temperature of at least 400° C. Further, a single crystal semiconductor layer which is obtained by separating a single crystal semiconductor film with a desired thickness from a single crystal semiconductor substrate and bonding the single crystal semiconductor film to the formation substrate 100 is also included in the crystalline semiconductor layer in the present specification.

Then, the interlayer insulating film 111, the passivation film 110, and the gate insulating film 106 are etched to form contact holes reaching the crystalline semiconductor layers 103, 104, and 105. Then, a laser beam is emitted to form a through-hole 112 which penetrates through at least the interlayer insulating film 111, (the passivation film 110,) the gate insulating film 106, and the base insulating film 102 (see FIG. 1B). At this time, the through-hole 112 may reach (penetrate into) the formation substrate 100.

Figure 1C:
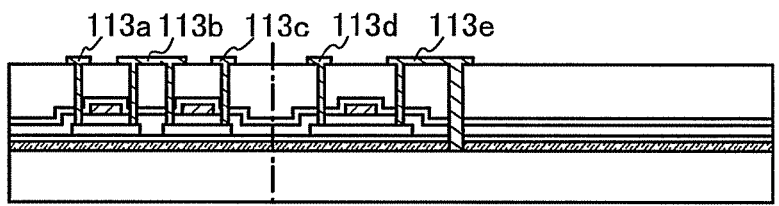

Next, wirings 113a, 113b, 113c, 113d, and 113e, and other wirings which are not shown are formed (see FIG. 1C). The wirings 113a and 113b are electrically connected to the crystalline semiconductor layer 103 in two of the contact holes. The wirings 113b and 113c are electrically connected to the crystalline semiconductor layer 104 in two of the contact holes. The wirings 113d and 113e are electrically connected to the crystalline semiconductor layer 105 in two of the contact holes. The wiring 113e is formed so as to be electrically connected to the crystalline semiconductor layer 105 and so as to reach (penetrate into) at least the separation layer 101 in the through-hole 112. Note that the wiring 113e may reach (penetrate into) the formation substrate 100.

Figure 1D:
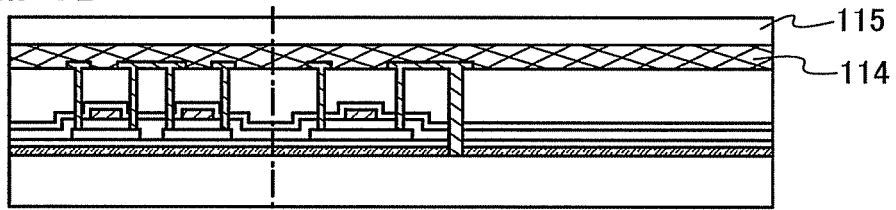
Figure 1E:
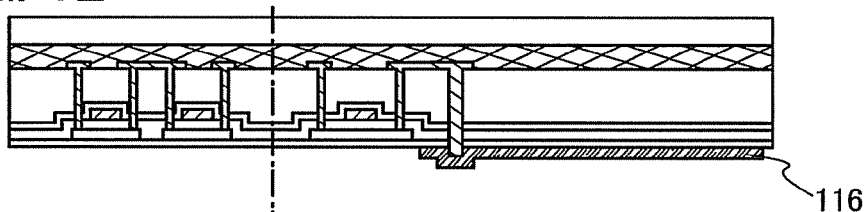

Then, an adhesive layer 114 is formed over the wirings 113a to 113e and the interlayer insulating film 111 to bond a flexible substrate 115 thereto (see FIG. 1D).

Then, a layer provided with elements from the base insulating film 102 to the flexible substrate 115 is separated from the formation substrate 100. The layer provided with elements may be separated by any method. Then, a first pixel electrode 116 is formed so as to be in contact with the base insulating film 102 exposed by the separation and so as to be electrically connected to the wiring 113e (see FIG. 1E).

After the first pixel electrode 116 is formed, a partition wall 117 is formed so as to cover the edge portion of the first pixel electrode 116. In the case where, for example, a contact hole reaches (penetrates into) the formation substrate 100 and the wiring 113e projects, an opening of the partition wall 117 is preferably formed to avoid the projection portion. The partition wall 117 is formed using an insulator. The insulator may be an organic insulator or an inorganic insulator. Then, an EL layer 118 in contact with at least the first pixel electrode 116 is formed. Further, a second pixel electrode 119 in contact with the EL layer 118 is formed. Thus, a light-emitting element 120 including the first pixel electrode 116, the EL layer 118, and the second pixel electrode 119 is formed. Then, an adhesive layer 121 is formed on the surface of the second pixel electrode 119 to bond a flexible substrate 122 thereto. Accordingly, a flexible light-emitting device can be manufactured (see FIG. 1F). Note that a film sealing layer may be formed using silicon nitride or the like between the second pixel electrode 119 and the adhesive layer 121. Alternatively, the film sealing layer may be formed instead of a combination of the adhesive layer 121 and the flexible substrate 122, or a structure body in which a fiber body is impregnated with an organic resin may be used as a flexible substrate.

Figure 1F:
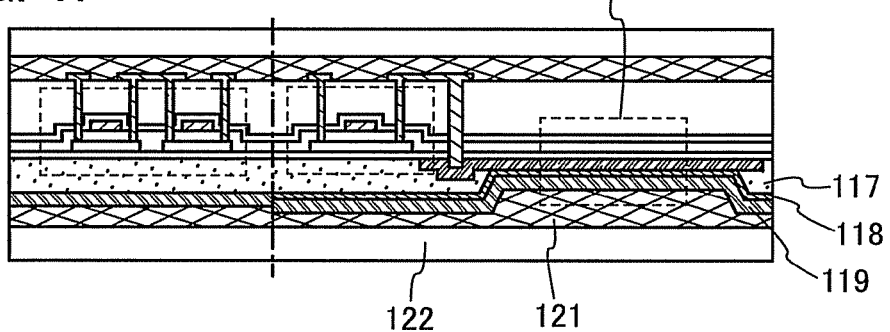

The first pixel electrode 116 may be formed using a conductor with fluidity, for example, conductive high molecule such as poly(3,4-ethylenediokythiophene)/poly(styrenesulfonic acid) (PEDOT/PSS) or polyaniline/poly(styrenesulfonic acid) (PAni/PSS), or conductive paste such as silver paste. In this case, after the formation substrate 100 and the layer provided with elements from the base insulating film 102 to the flexible substrate 115 are separated from each other at the interface between the separation layer 101 and the base insulating film 102, the partition wall 117 is formed so that the wiring 113*e* is exposed. Then, by a droplet discharge method or the like which is typified by an inkjet method, the first pixel electrode 116 is formed in the opening of the partition wall 117. The first pixel electrode 116 is formed using a conductor with fluidity. This is a preferable structure because the surface of the first pixel electrode 116 can be planarized even when the wiring 113*e* projects from the base insulating film 102. After that, a flexible light-emitting device as shown in FIG. 1F may be manufactured.

The EL layer 118 may be formed by a dry process such as deposition or by a wet process such as an ink-jet method.

FIGS. 2A to 2F show a manufacturing method of a flexible light-emitting device which is different from the manufacturing method shown in FIGS. 1A to 1F. Note that in order to prevent complicated description, a process as in FIGS. 1A to 1F is simply described. Further, as for the description on a material, a possible structure, and other common part, refer to the description of corresponding part of FIGS. 1A to 1F.

Figure 2A:
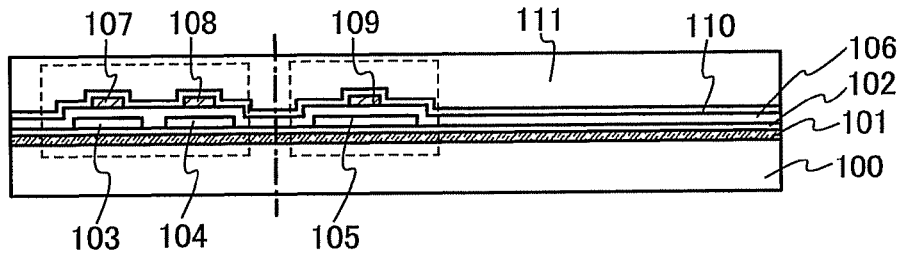
FIGS. 2A to 2F are cross-sectional views showing a flexible light-emitting device and a method for manufacturing the flexible light-emitting device according to one embodiment of the present invention.

First, in a manner similar to FIGS. 1A to 1F, the separation layer 101, the base insulating film 102, the crystalline semiconductor layers 103, 104, and 105, the gate insulating film 106, the gate electrodes 107, 108, and 109, the passivation film 110, and the interlayer insulating film 111 are formed over the formation substrate 100 (see FIG. 2A).

Figure 2B:
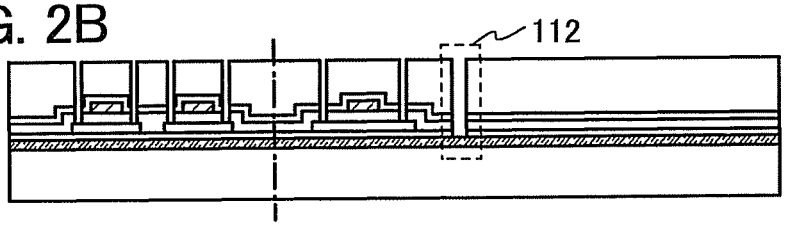

Then, the interlayer insulating film 111, the passivation film 110, and the gate insulating film 106 are etched to form contact holes reaching the crystalline semiconductor layers 103, 104, and 105 and to form the through-hole 112 which penetrates through at least the interlayer insulating film 111, (the passivation film 110,) the gate insulating film 106, and the base insulating film 102 (see FIG. 2B). In the case where the base insulating film 102 and the gate insulating film 106 are formed using silicon oxide, etching is continuously performed even after the contact hole reaches the crystalline semiconductor layer 105. Thus, the through-hole 112 penetrating through the base insulating film 102 can be made. In this case, as the material for the separation layer 101, a material having an etching rate sufficiently lower than that of silicon oxide in the etching is used, whereby the through-hole 112 can be formed down to the base insulating film 102 and etching can be stopped at the position. Thus, the wiring 113*e* can be prevented from projecting from the base insulating film 102. Note that the through-hole 112 may be formed separately from the contact holes.

Figure 2C:
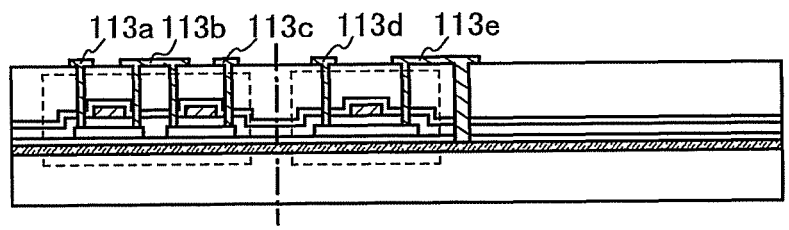

Then, as in a process of FIGS. 1A to 1F, the wirings 113*a*, 113*b*, 113*c*, 113*d*, and 113*e*, and other wirings which are not shown are formed (see FIG. 2C).

Part of the wiring 113*e* which is formed in the through-hole 112 may be formed separately from the other part of the wiring 113*e* reaching the crystalline semiconductor layer 105. In that case, it is preferable to reduce adhesion between a wiring formed in the through-hole 112 and the separation layer 101 by subjecting the surface of the separation layer 101 to $O_2$ ashing before the base insulating film 102 is formed over the separation layer 101.

Figure 2D:
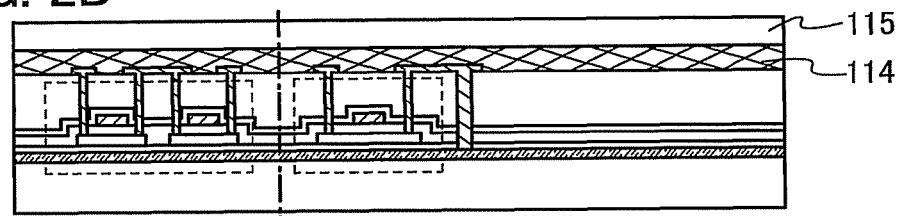
Figure 2E:
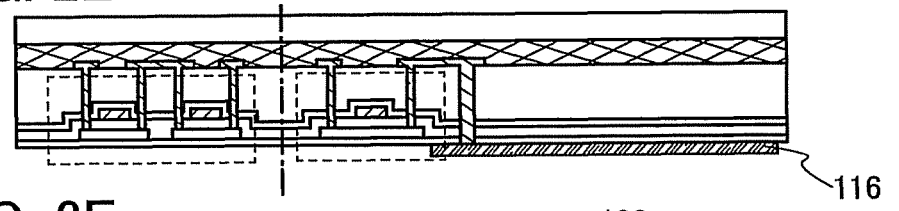
Figure 2F:
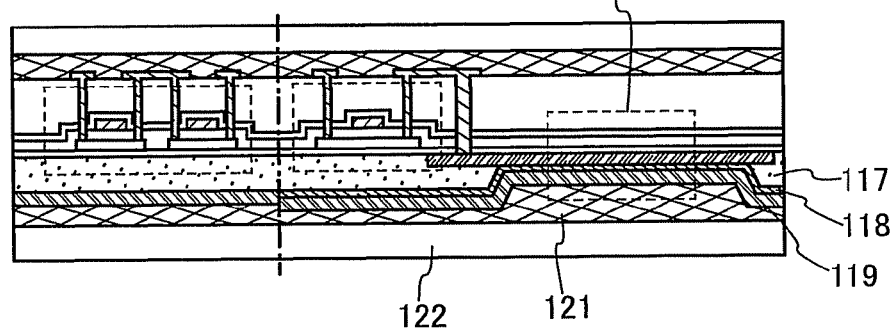

Then, the adhesion layer 114 is formed over the wirings 113*a* to 113*e* and the interlayer insulating film 111 to bond the flexible substrate 115 thereto (see FIG. 2D).

Then, the layer provided with elements from the base insulating film 102 to the flexible substrate 115 is separated from the formation substrate 100. Then, the first pixel electrode 116 is formed to be in contact with the base insulating film 102 exposed by the separation and to be electrically connected to the wiring 113*e* (see FIG. 2E).

After forming the first pixel electrode 116, the partition wall 117 is formed so as to cover the edge portion of the first pixel electrode 116. In the case where the wirings 113*a* to 113*e* and the wiring to be formed in the through-hole 112 are concurrently formed, the wiring 113*e* can be easily prevented from projecting from the base insulating film 102. The wiring 113*e* not projecting from the base insulating film 102 can avoid the inconvenience that the opening of the partition wall 117 is not formed in a portion existing the wiring 113*e*. Thus, the degree of freedom in the layout and the aperture ratio can be increased. Then, the first pixel electrode 116 is formed so as to be electrically connected to the wiring formed in the through-hole 112. Further, the EL layer 118 in contact with the first pixel electrode 116 is formed. Furthermore, the second pixel electrode 119 in contact with the EL layer 118 is formed. Thus, the light-emitting element 120 including the first pixel electrode 116, the EL layer 118, and the second pixel electrode 119 is formed. Then, the adhesive layer 121 is formed on the surface of the second pixel electrode 119 to bond the flexible substrate 122 thereto. Accordingly, a flexible light-emitting device can be manufactured (see FIG. 2F).

FIGS. 3A to 3F show a different manufacturing method of a flexible light-emitting device from the manufacturing methods shown in FIGS. 1A to 1F and FIGS. 2A to 2F. Note that in order to prevent complicated description, a process as in FIGS. 1A to 1F or FIGS. 2A to 2F is simply described. Further, as for the description on a material, a possible structure, and other common part, refer to the description of corresponding part of FIGS. 1A to 1F or FIGS. 2A to 2F.

First, the separation layer 101 is formed over the formation substrate 100. A first insulating film 300, a second insulating film 301, the crystalline semiconductor layers 103, 104, and 105, the gate insulating film 106, the gate electrodes 107, 108, and 109, the passivation film 110, and the interlayer insulating film 111 are formed over the separation layer 101 (see FIG. 3A). Note that the first insulating film 300 is used as a partition wall of a light-emitting element later. Considering that heat treatment is performed later in order to form the crystalline semiconductor layers, the first insulating film 300 is preferably formed using an inorganic insulating film. The second insulating film 301 is formed using a material different from the gate insulating film 106; however, it is not necessary to provide the second insulating film 301. Further, a base insulating film may be provided between the second insulating film 301 and the crystalline semiconductor layers 103 to 105 (or between the first insulating film 300 and the crystalline semiconductor layers 103 to 105 in the case where the second insulating film 301 is not provided).

Figure 3A:
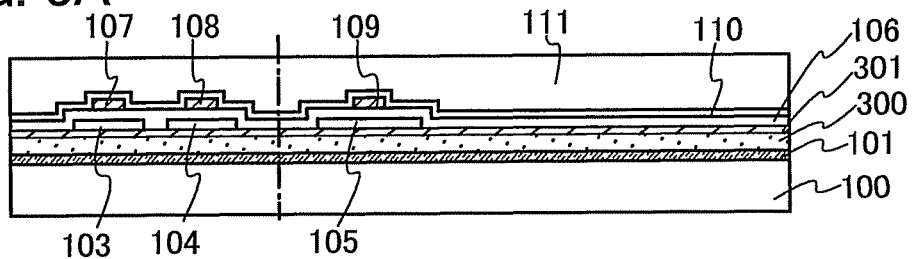
FIGS. 3A to 3F are cross-sectional views showing a flexible light-emitting device and a method for manufacturing the flexible light-emitting device according to one embodiment of the present invention.
Figure 3B:
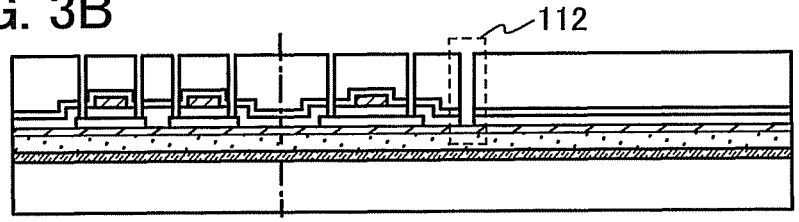

Then, the interlayer insulating film 111, the passivation film 110, and the gate insulating film 106 are etched to form the contact holes reaching the crystalline semiconductor layers 103, 104, and 105 and to form the through-hole 112 penetrating through at least the interlayer insulating film 111, the passivation film 110, and the gate insulating film 106 (see FIG. 3B). The second insulating film 301 is formed using a material having an etching rate sufficiently lower than that of a material for the gate insulating film 106. Thus, the second insulating film 301 serves as an etching stopper when etching is performed in order to form the through-hole 112, which can prevent the through-hole 112 from reaching (penetrating into) the first insulating film 300. Therefore, the wiring 113e can be prevented from projecting in the opening of the partition wall to be formed later. In the case where the second insulating film 301 is not provided, the first insulating film 300 is formed using a material having an etching rate sufficiently lower than that of a material for the gate insulating film 106 or etching time is tuned, whereby the depth of the through-hole 112 can be controlled.

Figure 3C:
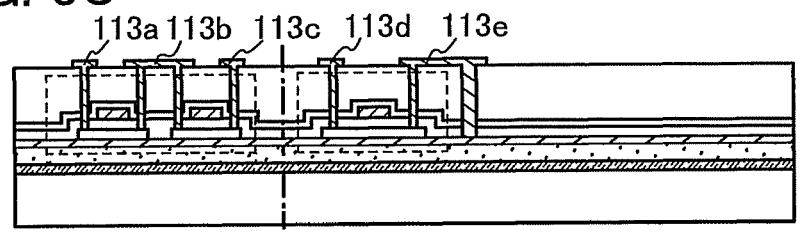
Figure 3D:
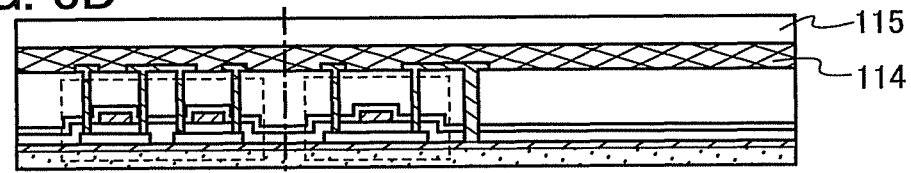
Figure 3E:
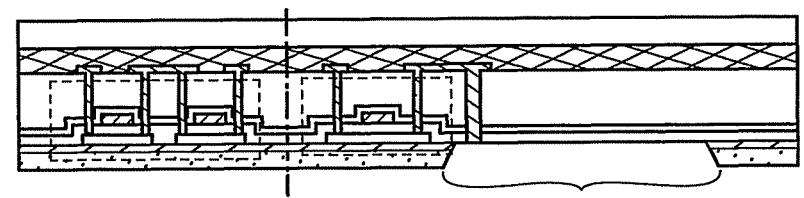
Figure 3F:
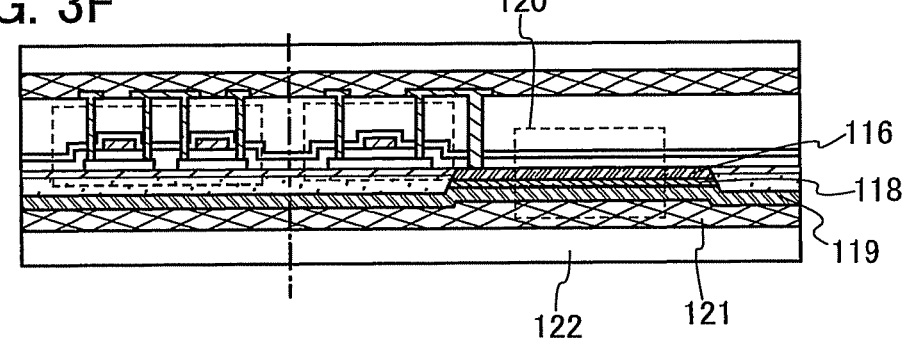

Then, as in a process of FIGS. 1A to 1F or FIGS. 2A to 2F, the wirings 113a, 113b, 113c, 113d, and 113e, and other wirings which are not shown are formed (see FIG. 3C).

Then, the adhesion layer 114 is formed over the wirings 113a to 113e and the interlayer insulating film 111 to bond the flexible substrate 115 thereto. The layer provided with elements from the first insulating film 300 to the flexible substrate 115 is separated from the formation substrate 100 at the interface between the separation layer 101 and the first insulating film 300 (see FIG. 3D).

Then, the first insulating film 300 and the second insulating film 301 are etched (in the case where the second insulating film 301 is not provided, only the first insulating film 300 is etched) so as to expose the wiring 113e. Thus, an opening 302 is formed, and the partition wall of the light-emitting element to be formed later is formed (see FIG. 3E).

After the partition wall is formed, the first pixel electrode 116 is formed using a conductor with fluidity. As examples of a conductor with fluidity, a conductive high molecule such as poly(3,4-ethylenedioxythiophene)/poly(styrenesulfonic acid) (PEDOT/PSS) or polyaniline/poly(styrenesulfonic acid) (PAni/PSS), and conductive paste such as silver paste can be given. Then, the EL layer 118 is formed so as to cover at least the first pixel electrode 116. The EL layer 118 may be formed by a dry process such as deposition or by a wet process such as an ink-jet method. FIGS. 3A to 3F show an example of forming the EL layer 118 by a droplet discharge method such as an inkjet method. Further, the second pixel electrode 119 is formed. Thus, the light-emitting element 120 including the first pixel electrode 116, the EL layer 118, and the second pixel electrode 119 is formed. Then, the adhesive layer 121 is formed on the surface of the second pixel electrode 119 to bond the flexible substrate 122. Accordingly, a flexible light-emitting device can be manufactured (see FIG. 3F).

FIGS. 4A to 4F show a manufacturing method of a flexible light-emitting device which is different from the manufacturing methods shown in FIGS. 1A to 1F, FIGS. 2A to 2F, and FIGS. 3A to 3F. Note that in order to prevent complicated description, a process as in FIGS. 1A to 1F, FIGS. 2A to 2F, and FIGS. 3A to 3F is simply described. Further, as for the description on a material, a possible structure, and other common part, refer to the description of corresponding part of FIGS. 1A to 1F, FIGS. 2A to 2F, and FIGS. 3A to 3F.

First, the separation layer 101, the base insulating film 102, the crystalline semiconductor layers 103, 104, and 105, the gate insulating film 106, the gate electrodes 107, 108, and 109, the passivation film 110, and the interlayer insulating film 111 are formed over the formation substrate 100. Then, the interlayer insulating film 111, the passivation film 110, and the gate insulating film 106 are etched to form the contact holes reaching the crystalline semiconductor layers 103 to 105. Then, as in the process of FIGS. 1A to 1F, the wirings 113a, 113b, 113c, 113d, and 113e, and other wirings which are not shown are formed (see FIG. 4A). Note that as shown in FIGS. 3A to 3F, the first insulating film 300 and the second insulating film 301 may be formed between the base insulating film 102 and the separation layer 101, or may be formed instead of the base insulating film 102. In that case, it is not necessary to form the second insulating film 301. Further, the wiring 113e which is electrically connected to the first pixel electrode 116 of the light-emitting element later is formed over the interlayer insulating film 111 so as to be extended to a region partially overlapping with the first pixel electrode 116.

Figure 4A:
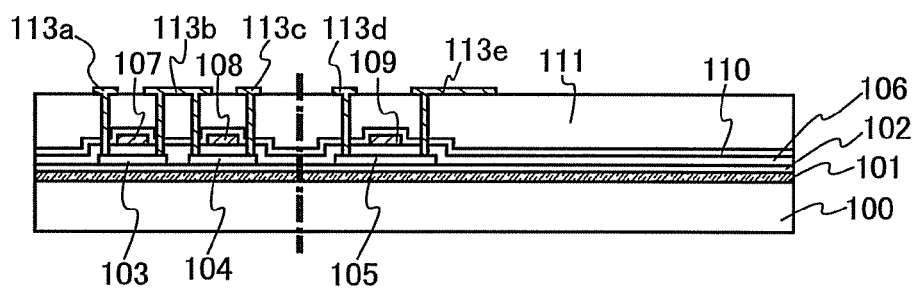
FIGS. 4A to 4F are cross-sectional views showing a flexible light-emitting device and a method for manufacturing the flexible light-emitting device according to one embodiment of the present invention.
Figure 4B:
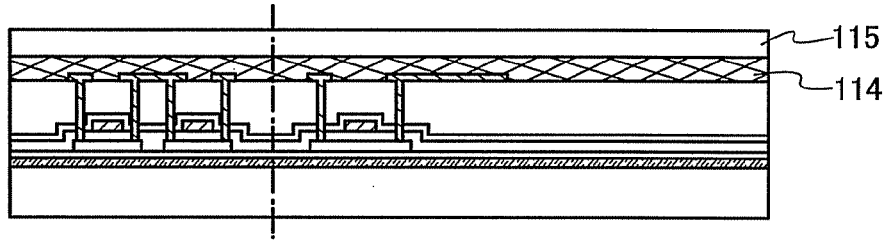
Figure 4C:
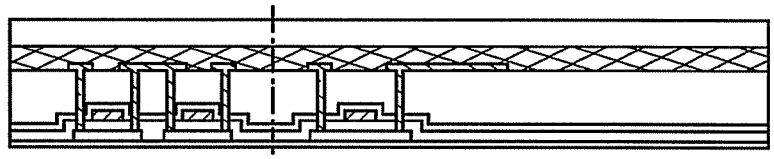
Figure 4D:
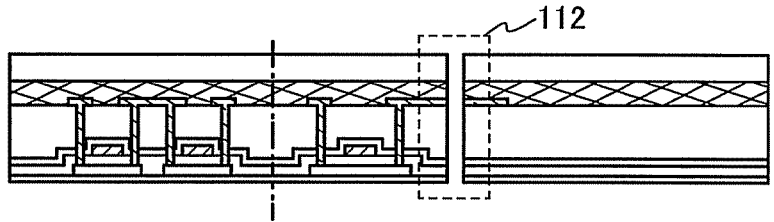

Then, the adhesive layer 114 is formed so as to cover the wirings 113a to 113e and the interlayer insulating film 111 to bond the flexible substrate 115 thereto (see FIG. 4B).

Then, the formation substrate 100 and the layer provided with elements from the base insulating film 102 to the flexible substrate 115 are separated from each other at the interface between the separation layer 101 and the base insulating film 102. Thus, a flexible substrate provided with a TFT using a crystalline semiconductor layer is obtained (see FIG. 4C).

Then, the flexible substrate provided with a TFT using a crystalline semiconductor layer is irradiated with a laser beam, whereby the through-hole 112 penetrating through the flexible substrate provided with a TFT using a crystalline semiconductor layer is formed. The through-hole 112 is formed in order to electrically connect the wiring 113e and the first pixel electrode 116 of the light-emitting element (see FIG. 4D).

Figure 4E:
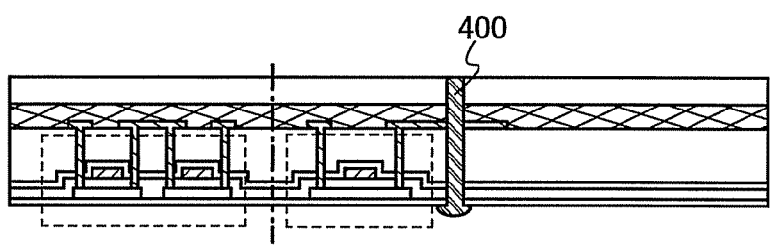
Figure 4F:
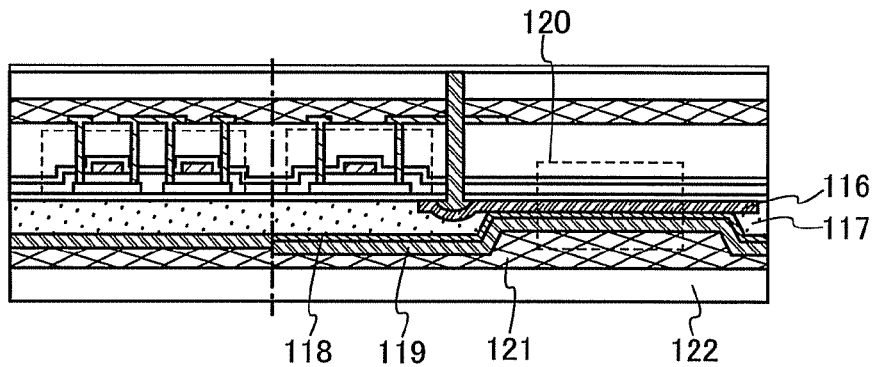

Then, a wiring 400 which is electrically connected to the wiring 113e is formed in the through-hole 112 (see FIG. 4E). The wiring 400 can be obtained by forming a conductive film by a sputtering method or the like and then etching the conductive film. Alternatively, the wiring 400 may be obtained by pouring conductive paste typified by silver paste into the through-hole 112. In FIG. 4E, the wiring 400 is obtained by pouring silver paste into the through-hole 112 from the base insulating film 102 side.

Then, the first pixel electrode 116 is formed on the base insulating film 102 so as to be electrically connected to the wiring 400. After the first pixel electrode 116 is formed, the partition wall 117 is formed so as to cover the edge portion of the first pixel electrode 116. In the case where the wiring 400 projects, an opening of the partition wall 117 is preferably formed to avoid the projection portion. Then, the EL layer 118 is formed so as to cover at least the exposed first pixel electrode 116. Then, the second pixel electrode 119 is formed. Thus, the light-emitting element 120 including the first pixel electrode 116, the EL layer 118, and the second pixel electrode 119 is formed. Then, the adhesive layer 121 is formed on the surface of the second pixel electrode 119 to bond the flexible substrate 122 thereto. Accordingly, a flexible light-emitting device can be manufactured (see FIG. 4F).

Note that in the case of forming the first insulating film 300 and the second insulating film 301 instead of the base insulating film 102 between the separation layer 101 and the crystalline semiconductor layers 103 to 105 to become a partition, the wiring 400 may be formed after the opening of the partition wall is formed.

A flexible light-emitting device manufactured as described above can be obtained by forming a crystalline semiconductor layer over a formation substrate such as a glass substrate which has heat resistance higher than a flexible substrate and then transferring it to a flexible substrate. Thus, a flexible light-emitting device provided with a TFT using a crystalline semiconductor layer can be obtained. Accordingly, a flexible light-emitting device which enables displaying of a high-quality image can be obtained.

In the case where a light-emitting element is formed over a formation substrate with a TFT interposed therebetween, it is difficult at present to transfer the light-emitting element onto an interlayer insulating film provided over the TFT. Therefore, in the case where a light-emitting element is formed over a formation substrate with a TFT interposed therebetween, a process as described below is needed. First, a first pixel electrode is formed over an interlayer insulating film. Then, the surface of the first pixel electrode is bonded to a support substrate. Then, a layer including elements from a base insulating film to the first pixel electrode is separated from a formation substrate. Then, the base insulating film exposed by the separation is bonded to a flexible substrate. Then, the support substrate is separated from the first pixel electrode. Then, an EL layer in contact with the first pixel electrode and a second pixel electrode in contact with the EL layer are formed. As for a flexible light-emitting device manufactured by a method as described above, a manufacturing process is complicated and the number of steps is large. However, as for a flexible light-emitting device manufactured by the manufacturing method of this embodiment, the first pixel electrode and the second pixel electrode can be provided on the base insulating film side exposed by separation from the formation substrate. Therefore, the operation for bonding and separating a substrate can be omitted, and thus, a manufacturing process can be made short and a yield can be improved.

In the case where the first pixel electrode is formed over a formation substrate before a base insulating film is formed, there is some possibility that the first pixel electrode is changed by heat treatment which is performed in forming a crystalline semiconductor layer. As specific examples, crystallization of the first pixel electrode in amorphous state due to the heat treatment, and the like can be given. Further, due to the above possibility, it is difficult to use an organic resin in order to planarize a step formed by providing the first pixel electrode. Besides, by manufacturing a first pixel electrode after transfer onto a flexible substrate is performed as in this embodiment, such inconvenience can be avoided. Note that a feature of a flexible light-emitting device manufactured as described above is that a first pixel electrode projects with respect to a surface of the base insulating film opposite to a surface on the TFT side.

Next, a flexible light-emitting device and a manufacturing method thereof which are described in this embodiment is described in detail.

As the formation substrate 100, a glass substrate, a quartz substrate, a sapphire substrate, a ceramic substrate, a metal substrate having an insulating layer on a surface of the metal substrate, or the like can be used. In the manufacturing process of a flexible light-emitting device, a formation substrate 100 can be selected as appropriate in accordance with the process. Since the formation substrate 100 is a rather flexible substrate, which is usually used for manufacturing displays, a pixel TFT and a color filter can be provided finely.

The separation layer 101 is formed to have a single-layer structure or a layered structure including a layer formed of an element such as tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), or silicon (Si); or an alloy material or a compound material containing any of the elements as its main component by a sputtering method, a plasma CVD method, an application method, a printing method, or the like. A crystal structure of a layer containing silicon may be amorphous, microcrystal, or polycrystal. Note that an application method includes a spin-coating method, a droplet discharge method, a dispensing method, a nozzle printing method, and a slot die coating method in its category here.

In the case where the separation layer 101 is formed to have a single-layer structure, a tungsten layer, a molybdenum layer, a layer containing a mixture of tungsten and molybdenum, a layer containing an oxide or an oxynitride of tungsten, a layer containing an oxide or an oxynitride of molybdenum, or a layer containing an oxide or an oxynitride of a mixture of tungsten and molybdenum is formed. Note that the mixture of tungsten and molybdenum corresponds to an alloy of tungsten and molybdenum, for example.

In the case where the separation layer 101 is formed to have a layered structure, a tungsten layer, a molybdenum layer, or a layer containing a mixture of tungsten and molybdenum is preferably formed as a first layer, and a layer containing an oxide, a nitride, an oxynitride, or a nitride oxide of tungsten, a layer containing an oxide, a nitride, an oxynitride, or a nitride oxide of molybdenum, or a layer containing an oxide, a nitride, an oxynitride, or a nitride oxide of a mixture of tungsten and molybdenum is preferably formed as a second layer.

In the case where the separation layer 101 is formed to have a layered structure including a layer containing tungsten and a layer containing an oxide of tungsten, it may be utilized that the layer containing tungsten is formed first and an insulating layer formed of oxide (for example, a silicon oxide layer) is formed thereover so that a layer containing an oxide of tungsten is formed at the interface between the tungsten layer and the insulating layer. Further, the surface of the layer containing tungsten may be subjected to thermal oxidation treatment, oxygen plasma treatment, or treatment using a strong oxidizing solution such as ozone water to form a layer containing an oxide of tungsten. Further, plasma treatment or heat treatment may be performed in an atmosphere of oxygen, nitrogen, dinitrogen monoxide, or a mixed gas of the gas and another gas. The same can be applied to the case of forming a layer containing a nitride, an oxynitride, or a nitride oxide of tungsten. After a layer containing tungsten is formed, an insulating layer formed using nitride, oxynitride, or nitride oxide (for example, a silicon nitride layer, a silicon oxynitride layer, or a silicon nitride oxide layer) may be formed thereover.

The base insulating film 102 can be formed using an inorganic insulating film of silicon oxide, silicon nitride, silicon oxynitride, silicon nitride oxide, or the like to have a single-layer structure or a layered structure.

The crystalline semiconductor layers 103 to 105 are formed using any of the following: a polycrystalline semiconductor layer fabricated by crystallizing with the use of light energy or thermal energy an amorphous semiconductor manufactured by a vapor-phase growth method or a sputtering method using a semiconductor source gas typified by silane or germane; a microcrystalline (also referred to as semiamorphous or microcrystal) semiconductor (hereinafter also referred to as "SAS") layer; a single crystal semiconductor layer provided by separating a single crystal semiconductor film with a desired thickness from a single crystal semiconductor substrate and then bonding the single crystal semiconductor film onto a formation substrate; or the like. A TFT using such a crystalline semiconductor layer has high mobility, and therefore, a light-emitting device manufactured using the TFT can display high-quality images.

Note that the microcrystalline semiconductor belongs to a metastable state which is intermediate between an amorphous state and a single crystal state when Gibbs free energy is considered. That is, the microcrystalline semiconductor is a semiconductor having a third state which is stable in terms of free energy and has a short range order and lattice distortion. Columnar-like or needle-like crystals grow in a normal direction with respect to a substrate surface. The Raman spectrum of microcrystalline silicon, which is a typical example of a microcrystalline semiconductor, is located in lower wave numbers than 520 $cm^{-1}$, which represents a peak of the Raman spectrum of single crystal silicon. That is, the peak of the Raman spectrum of the microcrystalline silicon exists between 520 $cm^{-1}$ which represents single crystal silicon and 480 $cm^{-1}$ which represents amorphous silicon. The microcrystalline semiconductor includes hydrogen or halogen of at least 1 at. % to terminate a dangling bond. Moreover, a rare gas element such as helium, argon, krypton, or neon may be included to further promote lattice distortion, so that stability is enhanced and a favorable microcrystalline semiconductor film can be obtained.

The microcrystalline semiconductor film can be formed by a high-frequency plasma CVD method with a frequency of several tens to several hundreds of megahertz or a microwave plasma CVD method with a frequency of 1 GHz or more. The microcrystalline semiconductor film can be formed in such a manner that silicon hydride, typically, $SiH_4$, $Si_2H_6$, $SiH_2Cl_2$, $SiHCl_3$, $SiCl_4$, $SiF_4$, or the like is diluted with hydrogen. With a dilution with one or plural kinds of rare gas elements selected from helium, argon, krypton, or neon in addition to silicon hydride and hydrogen, the microcrystalline semiconductor film can be formed. The flow rate of hydrogen is greater than or equal to 5 times and less than or equal to 200 times, preferably greater than or equal to 50 times and less than or equal to 150 times, much more preferably 100 times as much as that of silicon hydride.

As a crystalline semiconductor, polysilicon (polycrystalline silicon) and the like can be typically given. Polysilicon includes: so-called high-temperature polysilicon formed using polysilicon which is formed at processing temperatures of higher than or equal to 800° C. as a main material; so-called low-temperature polysilicon formed using polysilicon which is formed at processing temperatures of lower than or equal to 600° C. as a main material; polysilicon formed by crystallization of amorphous silicon by using an element that promotes crystallization or the like; and the like. It is needless to say that as mentioned above, a microcrystalline semiconductor or a semiconductor containing a crystal phase in part of a semiconductor layer may be used.

As a material of the semiconductor, as well as an element of silicon (Si), germanium (Ge), or the like, a compound semiconductor such as GaAs, InP, SiC, ZnSe, GaN, or SiGe can be used. Alternatively, an oxide semiconductor such as zinc oxide (ZnO), tin oxide ($SnO_2$), magnesium zinc oxide, gallium oxide, or indium oxide, an oxide semiconductor formed of any of the above oxide semiconductors, or the like may be used. For example, an oxide semiconductor formed of zinc oxide, indium oxide, and gallium oxide, or the like may be used. Further alternatively, an oxide semiconductor in which indium, gallium, or the like is added to zinc oxide may be used. In the case of using zinc oxide for the semiconductor layer, a gate insulating layer is preferably formed using $Y_2O_3$, $Al_2O_3$, $TiO_2$, or a stack of any of the above. For a gate electrode layer, a source electrode layer, and a drain electrode layer, ITO, Au, Ti, or the like is preferably used. Note that a transparent transistor can be used for a transistor in a pixel portion. The transparent transistor is a transistor in which an oxide semiconductor film transmitting visible light is used for a semiconductor film. When a light-emitting element is formed so as to overlap with such a transparent transistor, an area ratio of a light-emitting element to a pixel, which is a so-called aperture ratio, can be increased. Thus, a flexible display device with high luminance and high resolution can be formed. In addition, when a gate electrode, a source electrode, or a drain electrode of the transparent transistor is formed using a conductive film transmitting visible light, an aperture ratio can be further increased.

In the case where a polycrystalline semiconductor layer is used as the semiconductor layer, various methods (a laser crystallization method, a thermal crystallization method, a thermal crystallization method in which an element which promotes crystallization is added to an amorphous semiconductor layer, or the like) are employed as methods of manufacturing the polycrystalline semiconductor layer. In the case where an amorphous silicon film is irradiated with a laser beam to crystallize the amorphous silicon film without introducing the element which promotes crystallization, the amorphous silicon film is heated at 500° C. for one hour under a nitrogen atmosphere before irradiating the amorphous silicon film with a laser beam to make the concentration of hydrogen therein $1\times10^{20}$ atoms/$cm^3$ or less. An amorphous silicon film containing much can be broken by laser beam irradiation. A microcrystalline semiconductor can be crystallized by being irradiated with a laser beam to improve the crystallinity.

In the case where an element which promotes crystallization is introduced, as a method for introducing the metal element to the amorphous semiconductor layer, any method may be used as long as the metal element can exist on the surface of or inside the amorphous semiconductor layer. For example, a sputtering method, a CVD method, a plasma process method (including a plasma CVD method), an adsorption method, a method of applying a solution of metal salt, or the like can be used. Above all, the method using a solution is simple and advantageous in that the concentration of the metal element can be easily controlled. It is preferable to form an oxide film by UV light irradiation under an oxygen atmosphere, a thermal oxidation method, a treatment with ozone water or hydrogen peroxide including a hydroxyl radical, or the like in order to improve wettability of the surface of the amorphous semiconductor layer and to spread the aqueous solution over the entire surface of the amorphous semiconductor layer. The crystallization may be performed by heat treatment (at a temperature of 550° C. to 750° C., for 3 minutes to 24 hours) after an element which promotes crystallization is added to an amorphous semiconductor layer as described above. As the element which promotes (accelerates) the crystallization, one or more of iron (Fe), nickel (Ni), cobalt (Co), ruthenium (Ru), rhodium (Rh), palladium (Pd), osmium (Os), iridium (Ir), platinum (Pt), copper (Cu), and gold (Au) can be used. In the case where crystallization is performed by such a method, in order to remove or reduce the element which promotes crystallization from the crystalline semiconductor layer, a semiconductor layer containing an impurity element may be formed in contact with the crystalline semiconductor layer, so that gettering is performed. As the impurity element, an impurity element imparting n-type conductivity, an impurity element imparting p-type conductivity, a rare gas element, or the like can be used. For example, one or more of phosphorus (P), nitrogen (N), arsenic (As), antimony (Sb), bismuth (Bi), boron (B), helium (He), neon (Ne), argon (Ar), krypton (Kr), and xenon (Xe) can be used. The semiconductor layer containing the impurity element is formed over the crystalline semiconductor layer containing the element which promotes crystallization, and heat treatment is performed (at 550° C. to 750° C. for 3 minutes to 24 hours), whereby gettering can be performed. The element which promotes crystallization in the crystalline semiconductor layer moves into the semiconductor layer containing the impurity element; thus, the element which promotes crystallization in the crystalline semiconductor layer is removed or reduced. After that, the semiconductor layer containing the impurity element functioning as a gettering sink is removed.

In addition, heat treatment and laser light irradiation may be combined to crystallize the amorphous semiconductor layer. The heat treatment and/or the laser light irradiation may be independently performed a plurality of times.

In the case where a single crystal semiconductor is used as the crystalline semiconductor layer, the single crystal semiconductor can be formed by dividing a single crystal semiconductor substrate. This corresponds to a so-called SOI structure. As the single crystal semiconductor substrate, a commercially available semiconductor substrate can be used. For example, a single crystal semiconductor substrate that is formed of an element belonging to Group 14 of the periodic table, such as a single crystal silicon substrate, a single crystal germanium substrate, or a single crystal silicon germanium substrate can be given. As a method for manufacturing an SOI structure, a hydrogen ion implantation separation method or the like is given. In the case of using a substrate with high heat resistance, an SOI structure can be manufactured by using the hydrogen ion implantation separation method. In the case of using a substrate with comparatively low heat resistance such as a glass substrate to manufacture an SOI structure, a silicon oxide ($SiO_x$) film or a silicon oxynitride ($SiO_xN_y$ (x>y)) film with high planarity (specifically, the surface has a mean surface roughness (Ra) of 0.5 nm or less and a root-mean-square roughness (Rms) of 0.6 nm or less) is provided over a single crystal substrate. After a damaged region is formed in a desired region of the single crystal substrate by an ion beam, the single crystal substrate is attached to a formation substrate provided with a silicon nitride ($SiN_x$) film, silicon nitride oxide ($SiN_xO_y$ (x>y)) film, or a silicon oxynitride ($SiO_xN_y$ (x>y)) film. They are bonded together at 200° C. to 400° C. Then, heat treatment is performed at about 600° C. to 700° C., that is, at a temperature lower than a strain point of a substrate, whereby a single crystal semiconductor film is separated from a single crystal semiconductor substrate. Accordingly, an SOI structure can be manufactured.

The gate insulating film 106 and the gate electrodes 107 to 109 may be manufactured using a known structure and a known method. For example, the gate insulating film 106 may be formed using a known structure such as a single layer of silicon oxide or a layered structure of silicon oxide and silicon nitride. Further, the gate electrodes 107 to 109 may be formed of an element selected from Ag, Au, Cu, Ni, Pt, Pd, Ir, Rh, W, Al, Ta, Mo, Cd, Zn, Fe, Ti, Si, Ge, Zr, or Ba; or an alloy material or a compound material containing any of the elements as its main component by a CVD method, a sputtering method, a droplet discharge method, or the like. Alternatively, a semiconductor film typified by a polycrystalline silicon film doped with an impurity element such as phosphorus, or AgPdCu alloy may be used. Either a single-layer structure or a layered structure may be used.

Note that although top gate type transistors are shown in drawings as examples, bottom gate type transistors or transistors with other known structures may be used.

The passivation film 110 is not necessarily provided. In the case of providing the passivation film 110, the passivation film 110 may be formed using a silicon nitride film, a silicon oxide film, or the like.

The interlayer insulating film 111 is formed using an organic insulating material such as acrylic, polyimide, polyamide, polyimide amide, or benzocyclobutene; a siloxane material such as siloxane resin; or an inorganic insulating material such as silicon oxide or silicon nitride. Note that the siloxane material corresponds to a material having Si—O—Si bonds. Siloxane has a skeleton formed from a bond of silicon (Si) and oxygen (O). As a substituent, an organic group containing at least hydrogen (for example, an alkyl group or aromatic hydrocarbon) is used. In addition, a fluoro group may be used as the substituent. Further, both an organic group containing at least hydrogen and a fluoro group may also be used as a substituent.

The contact holes may be etched by any method, but dry etching is preferable. In this case, etching is performed using a gas by which a material for the gate insulating film or the like is etched at a rate sufficiently higher than a rate at which the crystalline semiconductor layer is etched. Typically, a mixed gas of $CHF_3$ and He can be used. In the case where the through-hole 112 is formed by etching and the base insulating film 102 is formed using the same or substantially the same material as the gate insulating film, over-etching is performed even after the contact holes reaches the crystalline semiconductor layers, whereby the through-hole 112 can be formed in the base insulating film 102.

In the case where the through-hole 112 is formed using a laser, the formation is performed by emitting a laser beam which is adjusted to have a desired shape at an irradiated spot by an optical system. As a laser of a laser beam, a continuous wave laser such as an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, or a helium-cadmium laser; or a continuous wave laser or a pulsed laser such as an eximer (ArF, KrF, or XeCl) laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a copper vapor laser, or a gold vapor laser can be used.

As the adhesive layers 114 and 121, various curable adhesives such as a reactive curable adhesive, a thermal curable adhesive, a photo curable adhesive such as an ultraviolet curable adhesive, and an anaerobic adhesive can be used.

As the flexible substrates 115 and 122, organic resin films or a variety of substrates with flexibility, or the like can be used. As a substrate with flexibility (also referred to as a flexible substrate), any of the following can be used: a substrate formed from PET (polyethylene terephthalate), PEN (polyethylene naphthalate), PES (polyethersulfone), polypropylene, polypropylene sulfide, polycarbonate, polyetherimide, polyphenylene sulfide, polyphenylene oxide, polysulfone, polyphthalamide, or the like; a film formed from polypropylene, polyester, vinyl, polyvinyl fluoride, vinyl chloride, or the like; paper formed from a fiber material; a stacked film of a base film (such as polyester, polyamide, an inorganic evaporation film, or paper) and an adhesive synthetic resin film (such as an acrylic synthetic resin or an epoxy synthetic resin); or the like. Alternatively, as a flexible substrate, a structure body including a fiber body and an organic resin may be used.

Use of a structure body including a fiber body and an organic resin as the flexible substrate 115 is preferable because reliability of a light-emitting device with respect to damage caused by application of point pressure or linear pressure is enhanced. A typical example of the structure body including a fiber body and an organic resin is an object which is formed in such a manner that, after a fiber body such as polyvinyl alcohol fiber, polyester fiber, polyamide fiber, polyethylene fiber, aramid fiber, polyparaphenylene benzobisoxazole fiber, glass fiber, or carbon fiber is impregnated with varnish in which a matrix resin such as an epoxy resin, an unsaturated polyester resin, a polyimide resin, or a fluorine resin is diluted with an organic solvent, drying is performed so that the organic solvent is volatilized and the matrix resin is semi-cured. After that, baking is performed at a temperature suitable for the matrix resin. Thus, the object can be used as a flexible support (a flexible substrate) of a TFT and a light-emitting element.

After the flexible substrate 115 is bonded, a physical or chemical trigger is formed in the separation layer 101 and physical removal is performed using the trigger, whereby separation from the formation substrate 100 can be performed. In this embodiment, a method for performing separation by such a method is mainly described. Other methods which can be used as appropriate include: a method in which a separation layer is formed between a formation substrate and a semiconductor element layer and a metal oxide film is formed between the separation layer and the semiconductor element layer, and the metal oxide film is weakened by crystallization, thereby separating the semiconductor element layer; a method in which an amorphous silicon film containing hydrogen is provided between a formation substrate having high heat resistance and a semiconductor element layer, and the amorphous silicon film is irradiated with a laser beam or etched to remove the amorphous silicon film, thereby separating the semiconductor element layer; a method in which a separation layer is formed between a formation substrate and a semiconductor element layer and a metal oxide film is provided between the separation layer and the semiconductor element layer, and the metal oxide film is weakened by crystallization, thereby performing separation at the weakened metal oxide film after part of the separation layer is etched away using a solution or a halogen fluoride gas such as $NF_3$, $BrF_3$, or $ClF_3$; a method in which a formation substrate over which an semiconductor element layer is formed is mechanically removed or is etched away using a solution or a halogen fluoride gas such as $NF_3$, $BrF_3$, or $ClF_3$; or the like. Alternatively, it is also possible to use a method in which a film containing nitrogen, oxygen, hydrogen, or the like (e.g., an amorphous silicon film containing hydrogen, an alloy film containing hydrogen, or an alloy film containing oxygen) is used as a separation layer, and the separation layer is irradiated with a laser beam so that nitrogen, oxygen, or hydrogen contained in the separation layer is released as a gas, thereby promoting separation between the semiconductor element layer and the formation substrate. Alternatively, a liquid may be made to permeate into the interface between the separation layer and the semiconductor element layer so that the semiconductor element layer is separated from the formation substrate. Any of the above-described separation methods can be combined as appropriate.

One of the first pixel electrode 116 and the second pixel electrode 119 serves as an anode and the other serves as a cathode.

As a material for the anode, metal, an alloy, an electrically conductive compound, and a mixture thereof or the like each having a high work function (specifically, 4.0 eV or more) is preferably used. Specifically, the following can be given, for example: indium tin oxide (ITO), indium tin oxide containing silicon or silicon oxide, indium zinc oxide (IZO), indium oxide containing tungsten oxide and zinc oxide (IWZO), and the like. Such conductive metal oxide films are usually formed by a sputtering method, but may also be formed by applying a sol-gel method or the like. For example, indium zinc oxide (IZO) can be formed by a sputtering method using a target in which 1 to 20 wt % zinc oxide is added to indium oxide. Indium tin oxide containing tungsten oxide and zinc oxide (IWZO) can be formed by a sputtering method using a target in which 0.5 wt % to 5 wt % of tungsten oxide and 0.1 wt % to 1 wt % of zinc oxide are contained in indium oxide. In addition, gold (Au), platinum (Pt), nickel (Ni), tungsten (W), chromium (Cr), molybdenum (Mo), iron (Fe), cobalt (Co), copper (Cu), palladium (Pd), a nitride of a metal material (such as titanium nitride), and the like can be given.

As a material for the cathode, metal, an alloy, an electrically conductive compound, and a mixture thereof or the like each having a low work function (specifically lower than or equal to 3.8 eV) can be used. Specific examples of such cathode materials are given below: elements belonging to Group 1 and Group 2 of the periodic table, that is, alkali metals such as lithium (Li) and cesium (Cs) and alkaline-earth metals such as magnesium (Mg), calcium (Ca), and strontium (Sr); alloys thereof (MgAg, AlLi); rare earth metals such as europium (Eu) and ytterbium (Yb); alloys thereof; and the like. Moreover, when the electron-injecting layer is provided between the cathode and the electron-transporting layer, any of a variety of conductive materials such as Al, Ag, ITO, and indium tin oxide containing silicon or silicon oxide can be used as a cathode regardless of its work function. A film of these conductive materials can be formed by a sputtering method, an ink-jet method, a spin coating method, or the like. In order to extract light emitted from the light-emitting element 120, it is preferable that at least one of the first pixel electrode and the second pixel electrode be transparent with respect to light emitted from the light-emitting element 120, or that at least one of the first pixel electrode and the second pixel electrode absorb or reflect less light emitted from the light-emitting element 120.

In the case where the first pixel electrode is formed after the partition wall is formed, the first pixel electrode is formed using a conductor with fluidity. Typically, a composition including a conductive high molecule such as poly(3,4-ethylenedioxythiophene)/poly(styrenesulfonic acid) (PEDOT/PSS) or polyaniline/poly(styrenesulfonic acid) (PAni/PSS), and conductive paste such as silver paste can be given.

As the conductive high molecule, a so-called π-electron conjugated conductive high molecule can be used. For example, polyaniline and/or a derivative thereof, polypyrrole and/or a derivative thereof, polythiophene and/or a derivative thereof, and a copolymer of two or more kinds of those materials can be given.

Specific examples of a conjugated conductive high molecule can be given below: polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxypyrrole), poly(3-methyl-4-hydroxypyrrole), poly(3-methoxypyrrole), poly(3-ethoxypyrrole), poly(3-octoxypyrrole), poly(3-carboxylpyrrole), poly(3-methyl-4-carboxylpyrrole), polyN-methylpyrrole, polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4- carboxylthiophene), poly(3,4-etlylenedioxythiophene), polyaniline, poly(2-methylaniline), poly(2-octylaniline), poly(2-isobutylaniline), poly(3-isobutylaniline), poly(2-anilinesulfonic acid), or poly(3-anilinesulfonic acid).

The aforementioned conductive high molecule can be used alone for the anode or the cathode, or an organic resin is added to the conductive high molecular composition in order to adjust film characteristics such that it can be used as a conductive composition.

As the organic resin, any kind of resin can be used like a thermosetting resin, a thermoplastic resin, a photocurable resin, or the like which is compatible with a conductive high molecule or can be mixed and dispersed into a conductive high molecule. For example, a polyester-based resin such as poly(ethylene terephthalate), poly(butylene terephthalate), or poly(ethylene naphthalate); a polyimide-based resin such as polyimide or polyamide imide; a polyamide resin such as polyamide 6, polyamide 6,6, polyamide 12, or polyamide 11; a fluorine resin such as poly(vinylidene fluoride), poly(vinyl fluoride), polytetrafluoroethylene, ethylene-tetrafluoroethylene copolymer, or polychlorotrifluoroethylene; a vinyl resin such as poly(vinyl alcohol), poly(vinyl ether), poly(vinyl butyral), poly(vinyl acetate), or polyvinylchloride; an epoxy resin; a xylene resin; an aramid resin; a polyurethane-based resin; a polyurea-based resin; a melamine resin; a phenol-based resin; polyether; an acrylic-based resin; or a copolymer thereof can be given.

Furthermore, the conductive high molecule or the conductive composition may be doped with an acceptor dopant or a donor dopant, whereby oxidation-reduction potential of a conjugated electron in the conductive high molecule may be changed in order to adjust electric conductivity of the conductive high molecule or conductive composition.

As an acceptor dopant, a halogen compound, an organic cyano compound, an organic metal compound, or the like can be used. As examples of the halogen compound, chlorine, bromine, iodine, iodine chloride, iodine bromide, iodine fluoride, and the like can be given. As the organic cyano compound, a compound in which two or more cyano groups are included in a conjugated bond can be used. Further, phosphorus pentafluoride, arsenic pentafluoride, antimony pentafluoride, boron trifluoride, boron trichloride, or boron tribromide; or an inorganic acid such as hydrochloric acid, sulfuric acid, nitric acid, phosphoric acid, fluoroboric acid, hydrofluoric acid, or perchloric acid; or an organic acid such as organic carboxylic acid or organic sulfonic acid can be used. As organic carboxylic acid and organic sulfonic acid, carboxylic acid compound and a sulfonic acid compound can be used. For example, tetracyanoethylene, tetracyanoethylene oxide, tetracyanobenzene, tetracyanoquinodimethane, tetracyanoazanaphthalene, and the like are given.

As a donor dopant, alkali metal, alkaline-earth metal, a quaternary amine compound, or the like can be used.

Further, a thin film used for the anode or the cathode can be formed by a wet process using a solution in which the conductive high molecule or the conductive composition is dissolved in water or an organic solvent (e.g., an alcohol solvent, a ketone solvent, an ester solvent, a hydrocarbon solvent, or an aromatic solvent).

The solvent for dissolving the conductive high molecule or the conductive composition is not particularly limited. A solvent which dissolves the above-described conductive high molecule and high molecular resin compound may be used. For example, the conductive high molecule or the conductive composition may be dissolved in a single solvent or a mixed solvent of the following: water, methanol, ethanol, propylene carbonate, N-methylpyrrolidone, dimethylformamide, dimethylacetamide, cyclohexanone, acetone, methylethylketone, methylisobutylketone, toluene, and/or the like.

After the conductive composition is dissolved in a solvent as described above, a film thereof can be formed by a wet process, such as an application method, a coating method, a droplet discharge method (also referred to as an inkjet method), or a printing method. The solvent may be dried with heat treatment or may be dried under reduced pressure. In the case where the organic resin is a thermosetting resin, heat treatment may be further performed. In the case where the organic resin is a photocurable resin, light irradiation treatment may be performed.

In the case where the partition wall 117 is formed after the first pixel electrode is formed, the partition wall 117 may be formed using either an organic insulating material or an inorganic insulating material. As the organic insulating material, polyimide, acrylic, or the like can be used. As the inorganic insulating material, a silicon oxide film, a silicon nitride film, or the like can be used. Note that in the case where the partition wall is formed before separation from the formation substrate is performed, the partition wall is preferably manufactured using an inorganic insulating material because manufacture of a crystalline semiconductor layer which needs to be subjected to heat treatment at a high temperature is performed after the formation of the partition wall.

After the first pixel electrode 116 is formed, the EL layer 118 is subsequently formed. Note that there is no particular limitation on the layered structure of the EL layer 118, and a layer containing a substance with a high electron transporting property, a layer containing a substance with a high hole transporting property, a layer containing a substance with a high electron injecting property, a layer containing a substance with a high hole injecting property, a layer containing a substance with a bipolar property (a substance with a high electron transporting property and a high hole transporting property), and the like may be combined as appropriate to form the EL layer 118. For example, the EL layer 118 can be formed by an appropriate combination of a hole injecting layer, a hole transporting layer, a light-emitting layer, an electron transporting layer, an electron injecting layer, and the like. In this embodiment, the EL layer with a structure including a hole injecting layer, a hole transporting layer, a light-emitting layer, and an electron transporting layer is described. Materials for forming each of the layers will be given below.

A hole-injecting layer is a layer that is provided in contact with the anode and contains a substance with a high hole-injecting property. In specific, molybdenum oxide, vanadium oxide, ruthenium oxide, tungsten oxide, manganese oxide, or the like can be used. Alternatively, the hole-injecting layer can also be formed using any of phthalocyanine based compounds such as phthalocyanine (abbreviation: $H_2Pc$) or copper phthalocyanine (abbreviation: CuPC), aromatic amine compounds such as 4,4'-bis[N-(4-diphenylaminophenyl)-N-phenylamino]biphenyl (abbreviation: DPAB) or 4,4'-bis(N-{4-[N-(3-methylphenyl)-N-phenylamino]phenyl}-N-phenylamino)biphenyl (abbreviation: DNTPD), high molecules such as poly(ethylenedioxythiophene)/poly(styrenesulfonic acid) (abbreviation: PEDOT/PSS), or the like.

Alternatively, as the hole-injecting layer, a composite material of a material with a high hole-transporting property containing an acceptor material may be used. Note that, by using the material with a high hole-transporting property containing an acceptor material, a material used to form an electrode may be selected regardless of its work function. In other words, besides a material with a high work function, a material with a low work function may also be used as the anode. As the acceptor substance, 7,7,8,8-tetracyano-2,3,5,6- tetrafluoroquinodimethane (abbreviation: $F_4$-TCNQ), chloranil, and the like can be given. In addition, a transition metal oxide can be given. In addition, oxides of metals that belong to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable because of a high electron accepting property. Among these, molybdenum oxide is especially preferable since it is stable in the air and its hygroscopic property is low so that it can be easily treated.

As the substance having high hole-transporting properties used for the composite material, any of various organic compounds such as an aromatic amine compound, a carbazole derivative, aromatic hydrocarbon, and a high-molecular compound (such as an oligomer, a dendrimer, or a polymer) can be used. The organic compound used for the composite material is preferably an organic compound having a high hole transporting property. Specifically, a substance having a hole mobility of $10^{-6}$ cm$^2$Vs or higher is preferably used. However, other materials than these may also be used as long as the hole-transporting property is higher than the electron-transporting property. The organic compound that can be used for the composite material is specifically shown below.

For example, the aromatic amine compound may be N,N'-di(p-tolyl)-N,N'-diphenyl-p-phenylenediamine (abbreviation: DTDPPA); 4,4'-bis[N-(4-diphenylaminophenyl)-N-phenylamino]biphenyl (abbreviation: DPAB); 4,4'-bis(N-{4-[N-(3-methylphenyl)-N-phenylamino]phenyl}-N-phenylamino)biphenyl (abbreviation: DNTPD); 1,3,5-tris[N-(4-diphenylaminophenyl)-N-phenylamino]benzene (abbreviation: DPA3B); or the like.

As the carbazole derivative, the following can be given specifically: 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); 3-[N-(1-naphtyl)-N-(9-phenylcarbazol-3-yl)amino]-9-phenylcarbazole (abbreviation: PCzPCN1). Moreover, as the carbazole derivative that can be used for the composite material, the following can be given: 4,4'-di(N-carbazolyl)biphenyl (abbreviation: CBP); 1,3,5-tris[4-(N-carbazolyl)phenyl]benzene (abbreviation: TCPB); 9-[4-(10-phenyl-9-anthryl)phenyl]-9H-carbazole (abbreviation: CzPA); 1,4-bis[4-(N-carbazolyl)phenyl]-2,3,5,6-tetraphenylbenzene; and the like.

As the aromatic hydrocarbons, the following can be given: 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. In addition, pentacene, coronene, or the like can also be used. Note that it is preferable that the number of carbon atoms that forms a condensed ring be 14 to 42 in terms of evaporativity at the time of evaporation or film quality after film formation, when the above aromatic hydrocarbon is formed by an evaporation method.

Aromatic hydrocarbon that can be used for the composite material may have a vinyl skeleton. As an aromatic hydrocarbon having a vinyl group, for example, 4,4'-bis(2,2-diphenylvinyl)biphenyl (abbreviation: DPVBi), 9,10-bis[4-(2,2-diphenylvinyl)phenyl]anthracene (abbreviation: DPVPA), and the like are given.

For example, as the high molecular compound, the following can be given: poly(N-vinylcarbazole) (abbreviation: PVK), poly(4-vinyl triphenylamine) (abbreviation: PVTPA), poly[N-(4-{N'-[4-(4-diphenylamino)phenyl]phenyl-N'-phenylamino}phenyl)methacrylamide] (abbreviation: PTPDMA), poly[N,N'-bis(4-butylphenyl)-N,N'-bis(phenyl)benzidine (abbreviation: Poly-TPD), and the like.

The hole-transporting layer is a layer that contains a material with a high hole-transporting property. As the substance having a high hole transporting property, the following can be given: an aromatic amine compound such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4-4'-diamine (abbreviation: TPD), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), or 4,4'-bis[N-(spiro-9,9'-bifluoren-2-yl)-N-phenylamino]-1,1'-biphenyl (abbreviation: BSPB). The materials described here are mainly materials having hole mobility of $10^{-6}$ cm$^2$/Vs or more. However, other materials than these may also be used as long as the hole-transporting property is higher than the electron-transporting property. Note that the layer containing a substance with high hole transporting properties is not limited to a single layer, and two or more layers containing the aforementioned substances may be stacked.

Further, a high molecular compound such as poly(N-vinylcarbazole) (abbreviation: PVK) or poly(4-vinyltriphenylamine) (abbreviation: PVTPA) can also be used for the hole transporting layer.

The light-emitting layer is a layer containing a light-emitting substance. The light-emitting layer may be either a so-called light-emitting layer of a single film including an emission center substance as its main component or a so-called light-emitting layer of a host-guest type in which an emission center substance is dispersed in a host material.

There is no limitation on an emission center substance used, and a known substance emitting fluorescence or phosphorescence can be used. As a fluorescent substance, there are fluorescent materials with an emission peak of greater than or equal to 450 nm, such as 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl) triphenylamine (abbreviation: PCBAPA), N,N"-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N",N",N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4- phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N'N'-tetrakis(4-methylphenyl)tetracene-5,11-diamine (abbreviation: p-mPhTD), 7,13-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), and 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), in addition to N,N'-bis[4-(9H-carbazol-9-yl)phenyl]-N,N'-diphenylstilbene-4,4'-diamine (abbreviation: YGA2S) and 4-(9H-carbazol-9-yl)-4'-(10-phenyl-9-anthryl)triphenylamine (abbreviation: YGAPA). As a phosphorescent substance, there are phosphorescent materials with an emission wavelength in the range of 470 nm to 500 nm, such as bis[2-(4',6'-difluorophenyl)pyridinato-N,$C^{2'}$]iridium(III)picolinate (abbreviation: FIrpic), bis[2-(3',5'-bistrifluoromethylphenyl)pyridinato-N,$C^{2'}$]iridium(III)picolinate (abbreviation: Ir(CF$_3$ppy)$_2$(pic)), bis[2-(4',6'-difluorophenyl)pyridinato-N,$C^{2'}$]iridium(III)acetylacetonate (abbreviation: FIracac); and phosphorescent materials with an emission wavelength longer than or equal to 500 nm, such as tris(2-phenylpyridinato)iridium(III) (abbreviation: Ir(ppy)$_3$), bis(2-phenylpyridinato)iridium(III)acetylacetonate (abbreviation: Ir(ppy)$_2$(acac)), tris(acetylacetonato)(monophenanthroline)terbium(III) (abbreviation: Tb(acac)$_3$(Phen)), bis(benzo[h]quinolinato)iridium(III)acetylacetonate (abbreviation: Ir(bzq)$_2$(acac)), bis(2,4-diphenyl-1,3-oxazolato-N,$C^{2'}$)iridium(III)acetylacetonate (abbreviation: Ir(dpo)$_2$(acac)), bis[2-(4'-perfluorophenylphenyl)pyridinato]iridium(III)acetylacetonate (abbreviation: Ir(p-PF-ph)$_2$(acac)), bis(2-phenylbenzothiazolato-N,$C^{2'}$)iridium(III)acetylacetonate (abbreviation: Ir(bt)$_2$(acac)), bis[2-(2'-benzo[4,5-α]thienyl)pyridinato-N,$C^{3'}$]iridium(III)acetylacetonate (abbreviation: Ir(btp)$_2$(acac)), bis(1-phenylisoquinolinato-N,$C^{2'}$)iridium(III)acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), (acetylacetonato)bis(2,3,5-triphenylpyrazinato)iridium(III) (abbreviation: Ir(tppr)$_2$(acac)), 2,3,7,8,12,13,17,18-octaethyl-21H,23H-porphyrinatoplatinum(II) (abbreviation: PtOEP), tris(1,3-diphenyl-1,3-propanedionato)(monophenanthroline)europium(III) (abbreviation: Eu(DBM)$_3$(Phen)), and tris[1-(2-thenoyl)-3,3,3-trifluoroacetonato](monophenanthroline)europium(III) (abbreviation: Eu(TTA)$_3$(Phen)), in addition to bis[2-(4',6'-difluorophenyl)pyridinato-N,$C^{2'}$]iridium(III)tetrakis(1-pyrazolyl)borate (abbreviation: FIr6). The emission center substance may be selected from the above materials or other known materials.

In the case of using host materials, the following can be given: metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)tris(1-phenyl-1H-benzimidazole) (abbreviation: TPBI), bathophenanthroline (abbreviation: BPhen), bathocuproine (abbreviation: BCP), and 9-[4-(5-phenyl-1,3,4-oxadiazol-2-yl)phenyl]-9H-carbazole (abbreviation: CO11); and aromatic amine compounds such as NPB (or α-NPD), TPD, and BSPB. In addition, condensed polycyclic aromatic compounds such as anthracene derivatives, phenanthrene derivatives, pyrene derivatives, chrysene derivatives, and dibenzo[g,p]chrysene derivatives are given. Specific examples of the condensed polycyclic aromatic compound include 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), 4-(9H-carbazol-9-yl)-4'-(10-phenyl-9-anthryl)triphenylamine (abbreviation: YGAPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N,9-diphenyl-N-(9,10-diphenyl-2-anthryl)-9H-carbazol-3-amine (abbreviation: 2PCAPA), 6,12-dimethoxy-5,11-diphenylchrysene, N,N,N',N',N",N",N'",N'"-octaphenyldibenzo[g,p]chrysene-2,7,10,15-tetramine (abbreviation: DBC1), 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3"-(benzene-1,3,5-triyl)tripyrene (abbreviation: TPB3), and the like. From those substances or other known substances, a substance may be selected which has a larger energy gap (or a triplet energy if the substance emits phosphorescence) than an emission center substance dispersed in the substance.

The electron-transporting layer is a layer containing a material with a high electron-transporting property. For example, a layer containing a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]quinolinato)beryllium (abbreviation: BeBq$_2$), or bis(2-methyl-8-quinolinolato)(4-phenylphenolato)aluminum (abbreviation: BAlq) can be used. Alternatively, a metal complex having an oxazole-based or thiazole-based ligand, such as bis[2-(2-hydroxyphenyl)benzoxazolato]zinc (abbreviation: Zn(BOX)$_2$) or bis[2-(2-hydroxyphenyl)-benzothiazolato]zinc (abbreviation: Zn(BTZ)$_2$) can be used. Besides the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadia-zol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can also be used. The materials described here are mainly materials having electron mobility of $10^{-6}$ cm$^2$/Vs or more. Note that a substance other than the above substances may be used as long as it has a higher electron transporting property than a hole transporting property.

Further, the electron transporting layer may have either a single layer structure or a layered structure in which two or more layers made from the above mentioned substances are stacked.

Further, a layer for controlling transport of electron carriers may be provided between the electron-transporting layer and the light-emitting layer. Note that the layer for controlling transport of electron carriers is a layer obtained by adding a small amount of substance with a high electron-trapping property to a layer containing a high electron transporting substance as described above. The layer for controlling transport of electron carriers controls electron carriers, whereby carrier balance can be adjusted. Such a structure is very effective in suppressing a problem (such as shortening of element lifetime) caused when electrons pass through the light-emitting layer.

Further, an electron-injecting layer may be provided in contact with the electrode to be a cathode. As the electron injecting layer, alkali metal, alkaline earth metal, or a compound thereof such as lithium fluoride (LiF), cesium fluoride (CsF), or calcium fluoride (CaF$_2$) can be employed. For example, a layer which contains a substance having an electron transporting property and an alkali metal, an alkaline earth metal, or a compound thereof (an Alq layer including magnesium (Mg) for example) can be used. Note that it is preferable that the layer formed of a substance having an electron-transporting property in which an alkali metal or an alkaline earth metal is mixed be used as the electron-injecting layer because electrons can be efficiently injected from the cathode.

Embodiment 2

Figure 5A:
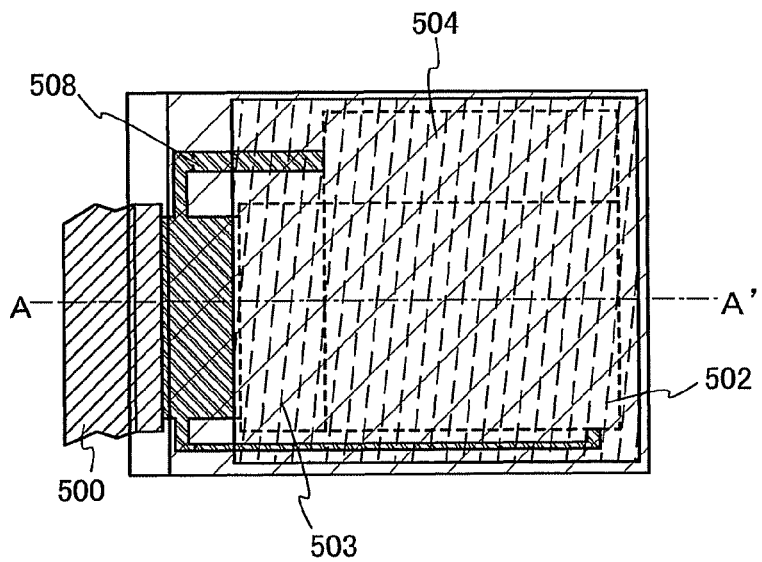
FIGS. 5A to 5C are a top view and cross-sectional views showing a flexible light-emitting device and a method for manufacturing the flexible light-emitting device according to one embodiment of the present invention.
Figure 5B:
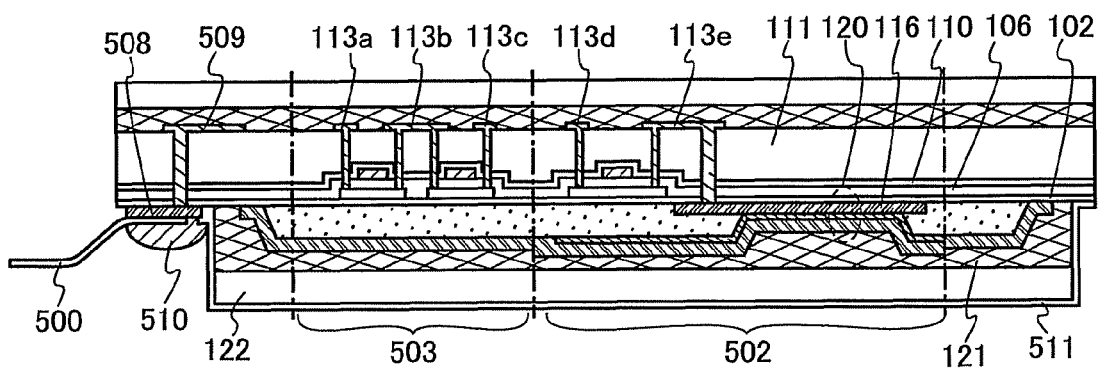
Figure 5C:
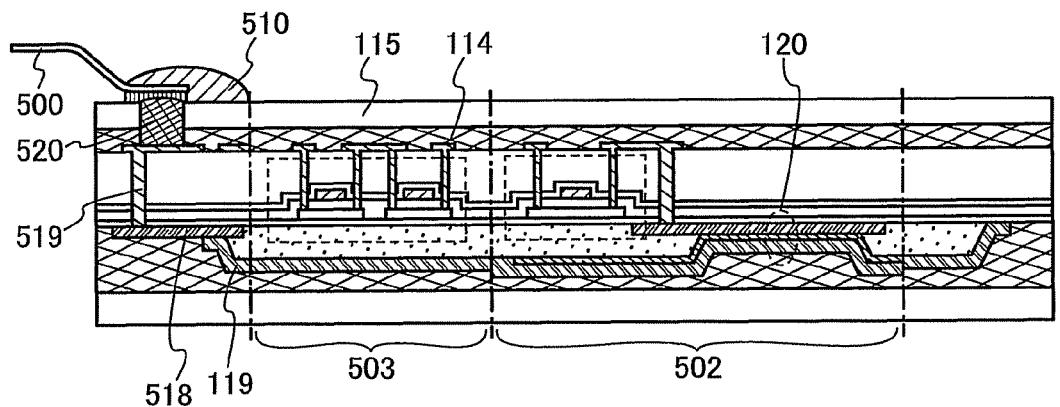

FIGS. 5A to 5C are a top view and cross-sectional views of light-emitting devices of module type (also referred to as EL modules).

FIG. 5A is a top view for showing an EL module, and FIG. 5B is a drawing showing part of a cross section taken along line A-A' of FIG. 5A. In FIG. 5A, reference numeral 500 denotes a flexible printed circuit (FPC) that is an external input terminal; reference numeral 508 denotes a wiring for transmitting a signal to be input to a source side driver circuit 504 and a gate side driver circuit 503; and reference numeral 502 denotes a pixel portion. The pixel portion and the driver circuits can be manufactured according to Embodiment 1 described above.

The FPC 500 is an external input terminal which transmits a video signal or a clock signal to the source side driver circuit 504 and the gate side driver circuit 503. Note that only the FPC 500 is shown here; however, a printed wiring board (PWB) may be attached to the FPC. The light emitting device in this specification includes not only a light emitting device itself but also a light emitting device mounted with an FPC or a PWB attached.

FIG. 5B is a cross-sectional view taken along line A-A' of FIG. 5A. The FPC 500 may be reinforced with a resin 510. Further, a protective film 511 may be formed so as to cover a flexible substrate 122 which is provided on the light-emitting element 120 side with an adhesive layer 121 interposed between a surface on the light-emitting element 120 side and the flexible substrate 122.

A signal for driving a TFT of the driver circuit is input through the wiring 508 and a through wiring 509 from the FPC 500. The through wiring 509 is formed so as to penetrate through a base insulating film 102, a gate insulating film 106, a passivation film 110, and an interlayer insulating film 111. In addition, the through wiring 509 is formed concurrently with the wirings 113a to 113e. A through-hole for the through wiring 509 may be formed in a manner similar to a through-hole reaching in contact with a first pixel electrode 116 of the wiring 113e.

FIG. 5C is a cross-sectional view taken along line A-A' of FIG. 5A which is different from FIG. 5B. In FIG. 5C, the FPC 500 is provided over a flexible substrate 115 with the adhesive layer 114 interposed between the surface on the TFT side and the flexible substrate 115. A second pixel electrode 119 of the light-emitting element 120 is electrically connected to the FPC 500 through a wiring 518, a through wiring 519, and a wiring 520. The through wiring 519 can be formed concurrently with the wiring 113e in a manner similar to the through wiring 509 in FIG. 5B.

The wiring 520 is a wiring for connecting the through wiring 519 and the FPC 500. The wiring 520 may be formed by any method; however, in the case where a structure body including an organic resin is used instead of the adhesive layer 114 and the flexible substrate 115, conductive paste including conductive particles of silver or the like, an organic resin, and a solvent is disposed on a position of the structure body where the wiring 520 is to be formed before the structure body is baked. Thus, the wiring 520 can be formed simply.

Embodiment 3

In this embodiment, electronic devices each including the light-emitting device described in Embodiment 1 or Embodiment 2 will be described.

Examples of the electronic devices each including the light-emitting device described in Embodiment 1 or Embodiment 2 include cameras such as video cameras or digital cameras, goggle type displays, navigation systems, audio playback devices (e.g., car audio systems and audio systems), computers, game machines, portable information terminals (e.g., mobile computers, cellular phones, portable game machines, and electronic books), image playback devices in which a recording medium is provided (specifically, devices that are capable of playing back recording media such as digital versatile discs (DVDs) and equipped with a display unit that can display images), and the like. Specific examples of these electronic devices are shown in FIGS. 6A to 6E.

Figure 6A:
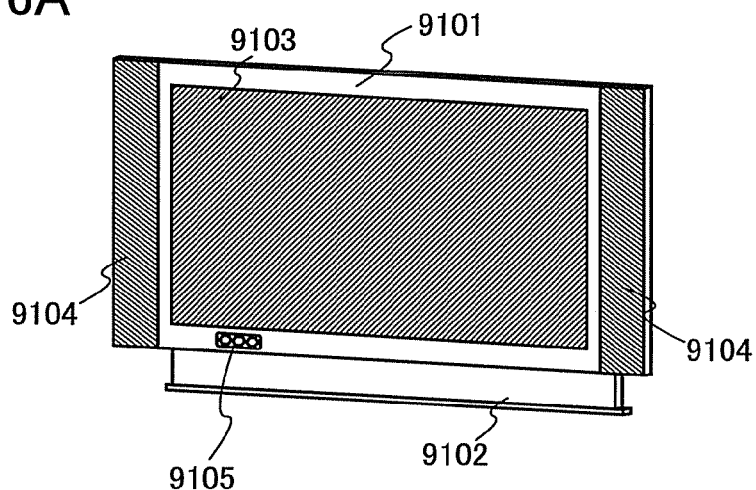
FIGS. 6A to 6E are drawings showing electronic devices according to one embodiment of the present invention.

FIG. 6A shows a television device which includes a housing 9101, a supporting base 9102, a display portion 9103, speaker portions 9104, video input terminals 9105, and the like. The display portion 9103 of the television device is manufactured using the light-emitting device described in Embodiment 1 or Embodiment 2. The television device mounted with the flexible light-emitting device capable of displaying a high-quality image allows the display portion 9103 to possess a curved shape, is lightweight, and supplies a high-quality image.

Figure 6B:
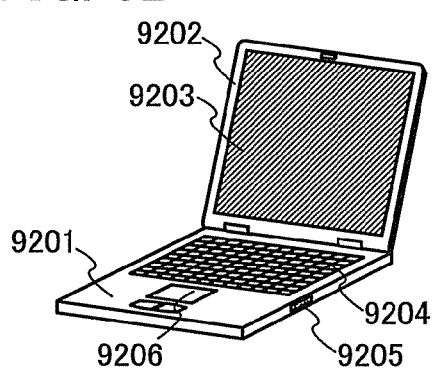

FIG. 6B shows a computer which includes a main body 9201, a housing 9202, a display portion 9203, a keyboard 9204, an external connection port 9205, a pointing device 9206, and the like. The display portion 9203 of the computer is manufactured using the light-emitting device described in Embodiment 1 or Embodiment 2. The computer mounted with the flexible light-emitting device capable of displaying a high-quality image allows the display portion 9203 to possess a curved shape, is lightweight, and supplies a high-quality image.

Figure 6C:
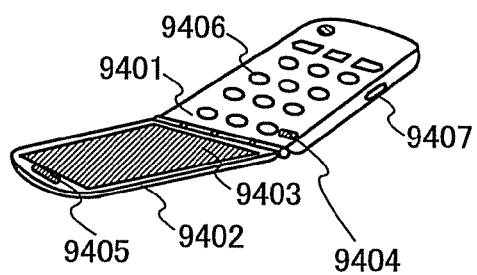

FIG. 6C shows a mobile phone which includes a main body 9401, a chassis 9402, a display portion 9403, an audio input portion 9404, an audio output portion 9405, an operation key 9406, an external connection port 9407, and the like. The display portion 9403 of the mobile phone is manufactured using the light-emitting device described in Embodiment 1 or Embodiment 2. The mobile phone mounted with the flexible light-emitting device capable of displaying a high-quality image allows the display portion 9403 to possess a curved shape, is lightweight, and supplies a high-quality image. In addition, the lightweight mobile phone can have appropriate weight even if a variety of additional values are added thereto, and thus, the mobile phone is suitable as a highly functional mobile phone.

Figure 6D:
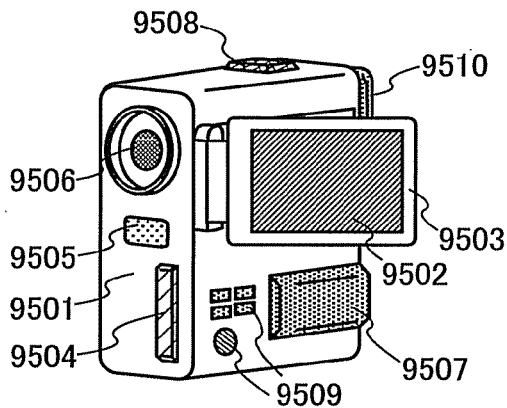

FIG. 6D shows a camera which includes a main body 9501, a display portion 9502, a housing 9503, an external connection port 9504, a remote control receiving portion 9505, an image receiving portion 9506, a battery 9507, an audio input portion 9508, operation keys 9509, an eyepiece portion 9510, and the like. The display portion 9502 of the camera is manufactured using the light-emitting device described in Embodiment 1 or Embodiment 2. The camera mounted with the flexible light-emitting device capable of displaying a high-quality image allows the display portion 9502 to possess a curved shape, is lightweight, and supplies a high-quality image.

Figure 6E:
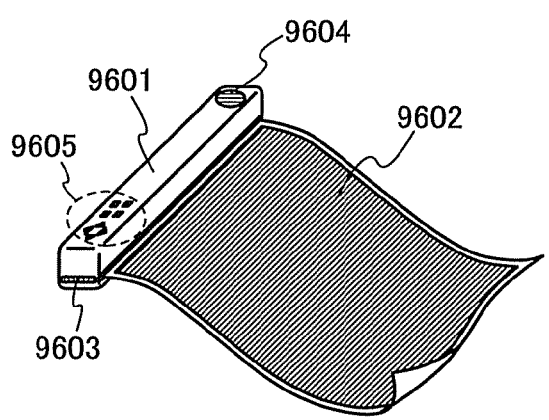

FIG. 6E shows a display which includes a main body 9601, a display portion 9602, an external memory insert portion 9603, a speaker portion 9604, operation keys 9605, and the like. The main body 9601 may be further mounted with an antenna for receiving an image to be displayed on a television, an external input terminal, an external output terminal, a battery, and the like. The display portion 9602 of the display is manufactured using the light-emitting device described in Embodiment 1 or Embodiment 2. The flexible display portion 9602 can be stored in the main body 9601 by being rolled up, which is suitable for being carried along. The display mounted with the flexible light-emitting device capable of displaying a high-quality image allows the display portion 9602 to be suitable for being carried along, is lightweight, and supplies a high-quality image.

As described above, the application range of the light-emitting device manufactured using the light-emitting device described in Embodiment 1 or Embodiment 2 is so wide that the light-emitting device can be applied to electronic devices of various fields.

This application is based on Japanese Patent Application serial no. 2008-211281 filed with Japan Patent Office on Aug. 20, 2008, the entire contents of which are hereby incorporated by reference.

What is claimed is:

1. A flexible light-emitting device comprising:
   a base insulating film;
   a thin film transistor formed over a first surface of the base insulating film;
   an interlayer insulating film formed over the first surface of the base insulating film with the thin film transistor interposed therebetween;
   a first pixel electrode formed under a second surface of the base insulating film opposite to the first surface;
   an electroluminescent layer formed under the second surface of the base insulating film with the first pixel electrode interposed therebetween;
   a second pixel electrode formed under the second surface of the base insulating film with the first pixel electrode and the electroluminescent layer interposed therebetween; and
   a wiring which is electrically connected to a semiconductor layer of the thin film transistor in a contact hole provided in the interlayer insulating film and is electrically connected to the first pixel electrode in a through-hole penetrating through at least the interlayer insulating film and the base insulating film.

2. The flexible light-emitting device according to claim 1, wherein the first pixel electrode projects with respect to the second surface of the base insulating film.

3. The flexible light-emitting device according to claim 1, further comprising: a first adhesive layer formed over the first surface of the base insulating film with the thin film transistor, the interlayer insulating film, and the wiring interposed therebetween; and a first flexible substrate formed over the first surface of the base insulating film with the thin film transistor, the interlayer insulating film, the wiring, and the first adhesive layer interposed therebetween.

4. The flexible light-emitting device according to claim 1, further comprising: a second adhesive layer formed under the second surface of the base insulating film with the first pixel electrode, the electroluminescent layer, and the second pixel electrode interposed therebetween; and a second flexible substrate formed under the second surface of the base insulating film with the first pixel electrode, the electroluminescent layer, the second pixel electrode, and the second adhesive layer interposed therebetween.

5. A method for fabricating a flexible light-emitting device comprising:
   forming a separation layer over a formation substrate;
   forming a base insulating film over the separation layer;
   forming an island-like crystalline semiconductor layer over the base insulating film;
   forming a gate insulating film over the crystalline semiconductor layer;
   forming a gate electrode over the gate insulating film which overlaps with the crystalline semiconductor layer;
   forming an interlayer insulating film over the gate electrode and the gate insulating film;
   forming a contact hole which penetrates through at least the interlayer insulating film and the gate insulating film and reaches the crystalline semiconductor layer, and a through-hole which penetrates through at least the interlayer insulating film, the gate insulating film, and the base insulating film and reaches the separation layer;
   forming a wiring which is electrically connected to the crystalline semiconductor layer in the contact hole and reaches at least the separation layer in the through-hole;
   bonding a flexible substrate onto the wiring and the interlayer insulating film;
   separating the base insulating film provided with the flexible substrate from the formation substrate;
   forming a first pixel electrode which is in contact with the base insulating film exposed by the separation and is electrically connected to the wiring;
   forming a partition wall covering an end portion of the first pixel electrode;
   forming an electroluminescent layer in contact with at least the first pixel electrode; and
   forming a second pixel electrode in contact with at least the electroluminescent layer.

6. A method for fabricating a flexible light-emitting device comprising:
- forming a separation layer over a formation substrate;
- forming a base insulating film over the separation layer;
- forming an island-like crystalline semiconductor layer over the base insulating film;
- forming a gate insulating film over the crystalline semiconductor layer;
- forming a gate electrode over the gate insulating film which overlaps with the crystalline semiconductor layer;
- forming an interlayer insulating film over the gate electrode and the gate insulating film;
- forming a contact hole which penetrates through at least the interlayer insulating film and the gate insulating film and reaches the crystalline semiconductor layer, and a through-hole which penetrates through at least the interlayer insulating film, the gate insulating film, and the base insulating film and reaches the separation layer;
- forming a wiring which is electrically connected to the crystalline semiconductor layer in the contact hole and reaches at least the separation layer in the through-hole;
- bonding a flexible substrate onto the wiring and the interlayer insulating film;
- separating the base insulating film provided with the flexible substrate from the formation substrate;
- forming a partition wall which is in contact with the base insulating film exposed by the separation and has an opening so as to expose at least the through-hole;
- disposing a conductive substance with fluidity in the opening of the partition wall to form a first pixel electrode;
- forming an electroluminescent layer in contact with at least the first pixel electrode; and
- forming a second pixel electrode in contact with at least the electroluminescent layer.

7. A method for fabricating a flexible light-emitting device comprising:
- forming a separation layer over a formation substrate;
- forming a base insulating film over the separation layer;
- forming an island-like crystalline semiconductor layer over the base insulating film;
- forming a gate insulating film over the crystalline semiconductor layer;
- forming a gate electrode over the gate insulating film which overlaps with the crystalline semiconductor layer;
- forming an interlayer insulating film over the gate electrode and the gate insulating film;
- forming a contact hole which penetrates through at least the interlayer insulating film and the gate insulating film and reaches the crystalline semiconductor layer;
- forming a wiring which is electrically connected to the crystalline semiconductor layer in the contact hole;
- bonding a flexible substrate onto the wiring and the interlayer insulating film;
- separating the base insulating film provided with the flexible substrate from the formation substrate;
- irradiating the flexible substrate with a laser beam to form a through-hole which penetrates through at least the base insulating film, the gate insulating film, the interlayer insulating film, the wiring, and the flexible substrate;
- forming a connection wiring which is electrically connected to the wiring in the through-hole;
- forming a first pixel electrode which is in contact with the base insulating film exposed by the separation and is electrically connected to the connection wiring;
- forming a partition wall covering an end portion of the first pixel electrode;
- forming an electroluminescent layer in contact with at least the first pixel electrode; and
- forming a second pixel electrode in contact with at least the electroluminescent layer.

* * * * *